(12) United States Patent
Sevier

(10) Patent No.: US 6,381,146 B1
(45) Date of Patent: Apr. 30, 2002

(54) MODULE REMOVAL SYSTEM

(75) Inventor: Richard G Sevier, Boise, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/672,370

(22) Filed: Sep. 28, 2000

(51) Int. Cl.$^7$ .............................. H05K 7/00; H01H 9/20
(52) U.S. Cl. .................... 361/754; 361/740; 361/798; 361/801; 439/160; 200/51 R
(58) Field of Search ................................ 361/683, 728, 361/740, 754, 759, 798, 801; 439/157, 160; 200/51 R, 292, 50.01, 50.03; 211/41.17

(56) References Cited

U.S. PATENT DOCUMENTS

| | | | |
|---|---|---|---|
| 3,637,960 A | * 1/1972 | Plantholt et al. | 200/50.03 |
| 4,313,150 A | * 1/1982 | Chu | 361/755 |
| 4,448,450 A | * 5/1984 | Kleinecke et al. | 292/210 |
| 4,798,923 A | * 1/1989 | Barwick et al. | 200/50.01 |
| 4,931,907 A | * 6/1990 | Robinson et al. | 361/727 |
| 5,010,426 A | * 4/1991 | Krenz | 360/97.01 |
| 5,398,162 A | * 3/1995 | Bice | 361/732 |
| 5,727,964 A | * 3/1998 | Douty et al. | 439/372 |
| 5,793,614 A | * 8/1998 | Tollbom | 361/732 |

* cited by examiner

Primary Examiner—Jayprakash N. Gandhi

(57) ABSTRACT

The invention includes a latch assembly movably mounted on a module. The module is removably supportably on a chassis, and movement of the latch assembly with respect to the module aids in removal and installation thereof. The invention also includes a sensor mounted on the module and configured to detect the movement of the latch assembly through a first range. The latch assembly must be moved through a second range in order to move the module relative to the chassis. However, the latch assembly is moved through the first range prior to moving through the second range. Thus, the sensor can detect imminent movement of the module relative to the chassis by detecting movement of the latch assembly through the first range. The latch assembly can be configured to be secured in a given position so as to prevent inadvertent movement of the latch assembly. The invention also includes a method for removal of a module which is supported on a chassis. The method includes moving a portion of the latch assembly through a first range and detecting that movement. The method also includes moving another portion of the latch assembly through a second range which results in movement of the module. The method can also include generating a signal in response to the detection of the movement of the latch through the first range.

21 Claims, 14 Drawing Sheets

MODULE REMOVAL SYSTEM

FIELD OF THE INVENTION

This invention pertains to methods and apparatus for aiding in the installation and removal of modules which are removably supported on a chassis.

BACKGROUND OF THE INVENTION

Often, prior art electrical equipment, such as large computers and disk arrays, is comprised of various electronic and electrical components which are supported on a common structural support such as a chassis, or frame, or the like. These modular components, or modules, can be one of any number of different devices such as a disk drive, a controller, a power supply, or a cooling fan, etc. Generally, the modules are coupled to a signal and/or power distribution network which is supported on the chassis or support. This signal and power distribution network allows signals and/or power to be passed between each of the modules and other components which make up the electrical equipment.

Additionally, each of the modules is generally configured to be easily removable from, and installable into, the chassis or support. This configuration allows the removal or replacement of any of the modules in the event such removal or replacement becomes necessary or desired. To facilitate the removal from, and installation into, the chassis, a coupling is utilized to connect each of the modules to the signal and power distribution network. These couplings are often comprised of two mating portions. One of the portions is usually mounted on the chassis and the second portion is mounted on the module. When the module is placed on the chassis, the two portions of the coupling matingly engage each other to connect the module to the distribution network. Likewise, when the module is removed from the chassis, the two portions of the coupling disengage each other so as to disconnect the module from the distribution network. Often, the two portions of the coupling have a slight interference-fit to both ensure adequate contact between the coupling portions and to minimize movement of the coupling portions relative to each other when connected. As a result, a considerable amount of force is often required to overcome the interference-fit when both connecting and disconnecting the two coupling portions.

To aid in overcoming the force required to connect the coupling portions, prior art modules are equipped with latches. These latches are often essentially in the form of a simple lever which is mounted on the front of the module and configured to pivot about an axis which is fixed on the module. The latch comprises a short engagement portion on one side of the axis and a long handle portion on the opposite side of the axis. As the module is placed onto the chassis, the engagement portion of the latch engages the chassis. A manual force can then be applied to the handle portion of the latch. The configuration of the latch provides a mechanical advantage which multiplies the manual force which is applied to the handle portion. This force-multiplication provided by the latch allows for the interference-fit of the coupling to be easily overcome when installing or removing a module from the chassis.

FIGS. 1 through 3 help to illustrate the configuration and operation of a typical prior art latch for use with a module and chassis as described above. FIG. 1 is an exploded perspective view of a prior art unit 10. The unit 10 includes a chassis 12 which is configured to removably support one or more modules 14. Although four modules are shown, it is understood that the chassis 12 can be configured to support any number of modules 14. Each of the modules 14 has a latch 16 which is configured to engage the chassis 12 as the respective module is installed into the chassis.

FIG. 2 is a top view of the unit 10 depicted in FIG. 1, which shows one of the modules 14 partially inserted into the chassis 12, and the other module fully inserted into the chassis. As is seen, a first coupling portion 20 is mounted on each of the modules 14. Additionally, each first coupling portion 20 has a corresponding second coupling portion 21 which is mounted on the chassis 12. Each of the first and second coupling portions 20, 21 are positioned so that, when the respective module 14 is fully installed into the chassis 12, the coupling portions are connected to one another. As is also seen, each of the latches 16 is movably mounted on each respective module 14. As shown, each latch 16 is configured to pivot, relative to the respective module 14, about a pivot point 17. Each of the latches can pivot along an arc indicated by the arrows 18.

FIG. 3 is another top view of the unit 10 which is depicted in FIG. 1. As shown in FIG. 3, one of the modules 14 has been fully installed into the chassis 12. If the latch 16 of the fully installed module 14 is pulled in the direction indicated by the arrow 26, then the module will be pulled slightly out of its fully installed position so that the coupling portions 20, 21 are nearly completely disconnected from one another. This is illustrated by the position of the other module 12 which is shown in FIG. 3. If the latch 16 of this other module 14 is moved in the direction indicated by the arrow 24, then the latch will engage the chassis 12 and the module 14 will be pushed fully into the chassis, whereupon the first and second coupling portions 20, 21 will fully connect. It is noted that the installation of the module 14 into, and removal of the module from, the chassis 12 is assisted in each case by the lever-action of the respective latch 16. That is, because of the off-set location of the pivot point 17 relative to the respective latch 16, the latch provides a mechanical advantage which aids in overcoming the force required to connect and disconnect the connector portions 20, 21 when installing and removing the module 14.

However, one problem associated with the prior art latch design is that it can cause a disruption of the operation of the modules 14. More specifically, if the latch 16 is pulled in the direction indicated by the arrow 26 shown in FIG. 3 while the module is operating, then the movement of the first and second coupling portions 20, 21 relative to one another can cause electrical noise and arcing. This electrical noise can disrupt the operation of the module 14. In the case in which the module comprises a controller or disk drive, for example, the disruption can include the loss of data, which is highly undesirable.

Preferably, the module 14 proceeds through a shut-down sequence prior to any movement thereof relative to the chassis 12. The shut-down sequence prepares the module 14 for disconnection from the distribution network, which prevents adverse effects associated with the disconnection of the coupling portions 20, 21 as described above. The shut-down sequence can be initiated by manual activation of a switch (not shown) located on the respective module 14 or on the chassis 12. However, disruption of the operation of the modules 14 can still occur if the respective latch 16 is inadvertently pulled without first activating the switch to initiate the shut-down sequence.

In some prior art equipment, various forms of mechanical interlocks (not shown) have been employed in an attempt to prevent inadvertent movement of the module 14 relative to the chassis 12, which in turn, would theoretically prevent the disruption of the operation of the module. However, in most cases, the interlocks still allow slight movement of the module 14 relative to the chassis 12 when the respective latch 16 is inadvertently pulled. This slight movement of the module 14 caused by the latch 16 is, in most cases, enough to cause disruption of the operation of the module. Additionally, the mechanical interlocks ad a considerable amount of complexity and bulk to the unit 10. What is needed, then, is a latch apparatus for use with a unit of electrical equipment in which the inadvertent movement of the module prior to initiation of the shut-down sequence is prevented.

Therefore, it is desirable to provide a latch apparatus which achieves the benefits to be derived from similar prior art devices, but which avoids the shortcomings and detriments individually associated therewith.

SUMMARY OF THE INVENTION

In accordance with a first embodiment of the present invention, a module removal system includes a latch assembly which is movably mounted on a module. The latch is configured to move so as to contact a chassis on which the module is supported in order to aid in removal and installation of the module. A sensor is also mounted on the module and configured to detect a given movement of the latch with respect to the module. The given movement of the latch occurs before the latch contacts the chassis. The sensor can send a signal to the module which enables the module to take appropriate measures in anticipation of disconnection and removal from the module.

In accordance with a second embodiment of the present invention, a module removal system includes a latch assembly which comprises an engagement portion which is rotatably mounted on a module, and a target portion which is rotatably mounted on the engagement portion. The engagement portion is configured to move so as to contact a chassis on which the module is supported in order to aid in removal and installation of the module. A sensor is mounted on the module and is configured to detect the presence of the handle portion when the latch is placed in a given position relative to the module. In the given position, the latch is prevented from moving relative to the module by the engagement of the target portion with the module.

In accordance with a third embodiment of the present invention, a module removal system includes a latch assembly which comprises an engagement portion and a target portion connected to the engagement portion, and wherein both are rotatably mounted on the module about a common axis. The engagement portion is configured to rotate so as to contact a chassis on which the module is supported in order to aid in removal and installation of the module. Movement of the target portion relative to the engagement portion is limited by a projection defined on the target portion which extends into a slot defined on the engagement portion. The projection is movably contained within the slot so as to limit the movement of the target portion relative to the engagement portion. The apparatus also comprises a sensor mounted on the module and configured to detect a given movement of the target portion. Movement of the target portion beyond the given movement causes rotation of the engagement portion.

In accordance with a fourth embodiment of the present invention, a module removal system includes a latch assembly which comprises an elongated engagement portion which is rotatably mounted on a module. Rotation of the engagement portion aides in the removal and installation of the module which is removably supported on a chassis. The latch also comprises a target portion which is slidably mounted on the engagement portion. The target portion includes a lock member defined thereon which is configured to engage with the module so as to substantially prevent rotation of the engagement portion relative to the module. The apparatus also includes a sensor which is mounted on the module and which is configured to detect the presence of the lock member when it is engaged with the module.

In accordance with a fifth embodiment of the present invention, a module removal system includes a latch assembly which comprises an engagement portion which is rotatably mounted on a module. The module is removably supported on a chassis and rotation of the engagement portion aids in the installation and removal of the module. The latch apparatus also comprises a target portion which is rotatably mounted on the engagement portion and which rotates about a secondary axis. A lock member is mounted on the target portion and configured to rotate therewith. The lock member can be engaged with the module when the engagement member is placed in a given position relative to the module. The engagement of the lock member with the module substantially prevents the rotation of the engagement member. The latch apparatus also comprises a sensor which is mounted on the module and is configured to detect the presence of the lock member when the lock member is engaged with the module.

In accordance with a further embodiment of the present invention, a method is disclosed of removing a module from its supported position on a chassis. The method includes moving a target portion of a latch assembly and detecting the movement thereof. The method also includes moving an engagement portion of the latch assembly after movement of the target portion. Movement of the engagement portion causes movement of the module. The method can further include generating a signal as a result of the detection of the movement of the target portion and can further include terminating the intended operation of the module in response to the signal.

DETAILED DESCRIPTION OF THE INVENTION

The invention includes methods and apparatus for aiding the removal and installation of a module which is supported on a chassis. The invention includes a latch assembly which is movably mounted on a module. The latch assembly is configured to aid in the installation and removal of the module by causing movement of the module relative to the chassis. The invention also includes a sensor which can be mounted on the module. The latch assembly can comprise a target portion, which moves through a first range of movement, and an engagement portion, which moves through a second range of movement. The sensor is configured to detect movement of the target portion. The engagement portion, when moved, can cause movement of the module.

Figure 4:
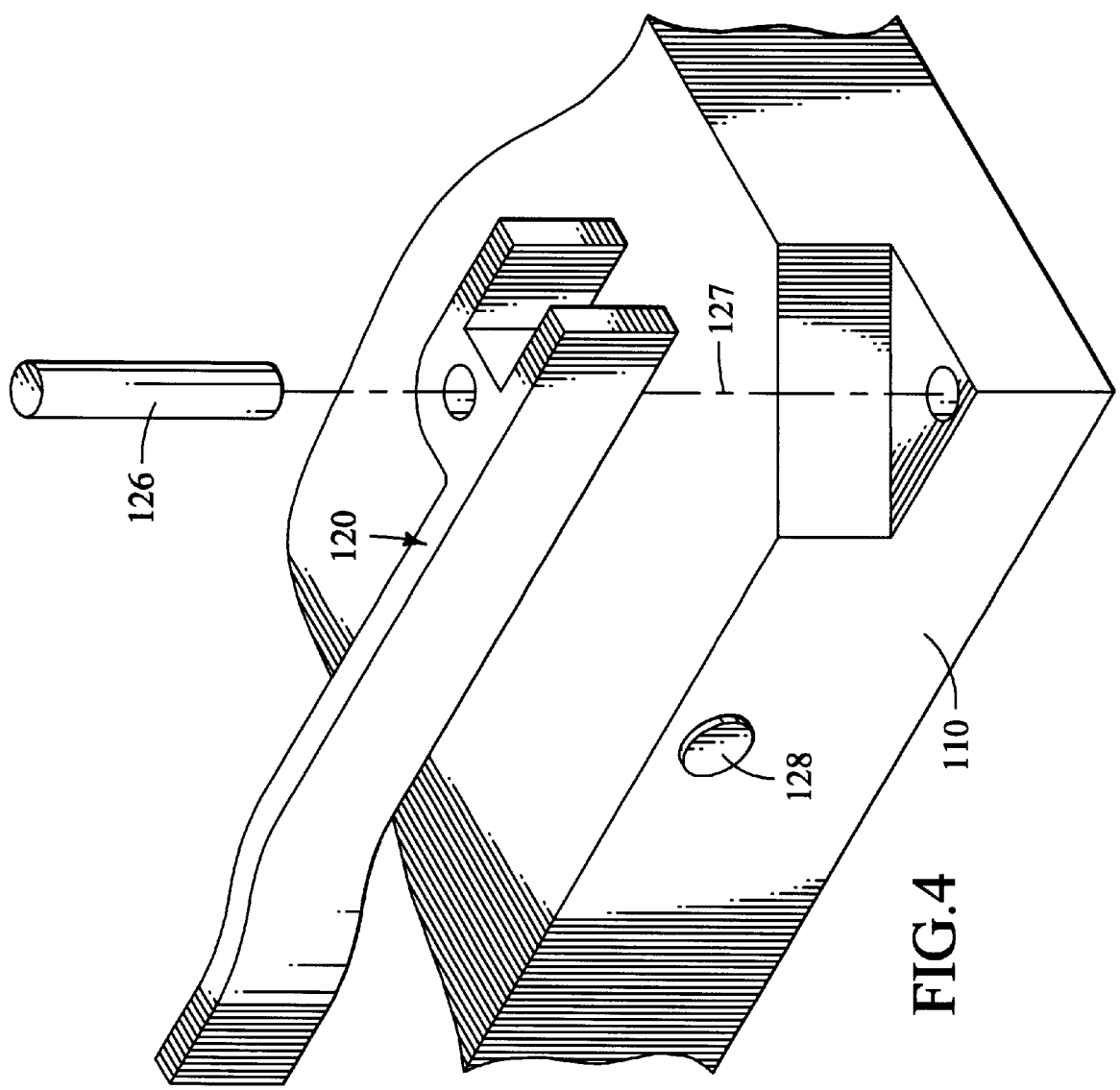
FIG. 4 is an exploded, partial perspective view of a latch assembly in accordance with a first embodiment of the present invention.
Figure 4A:
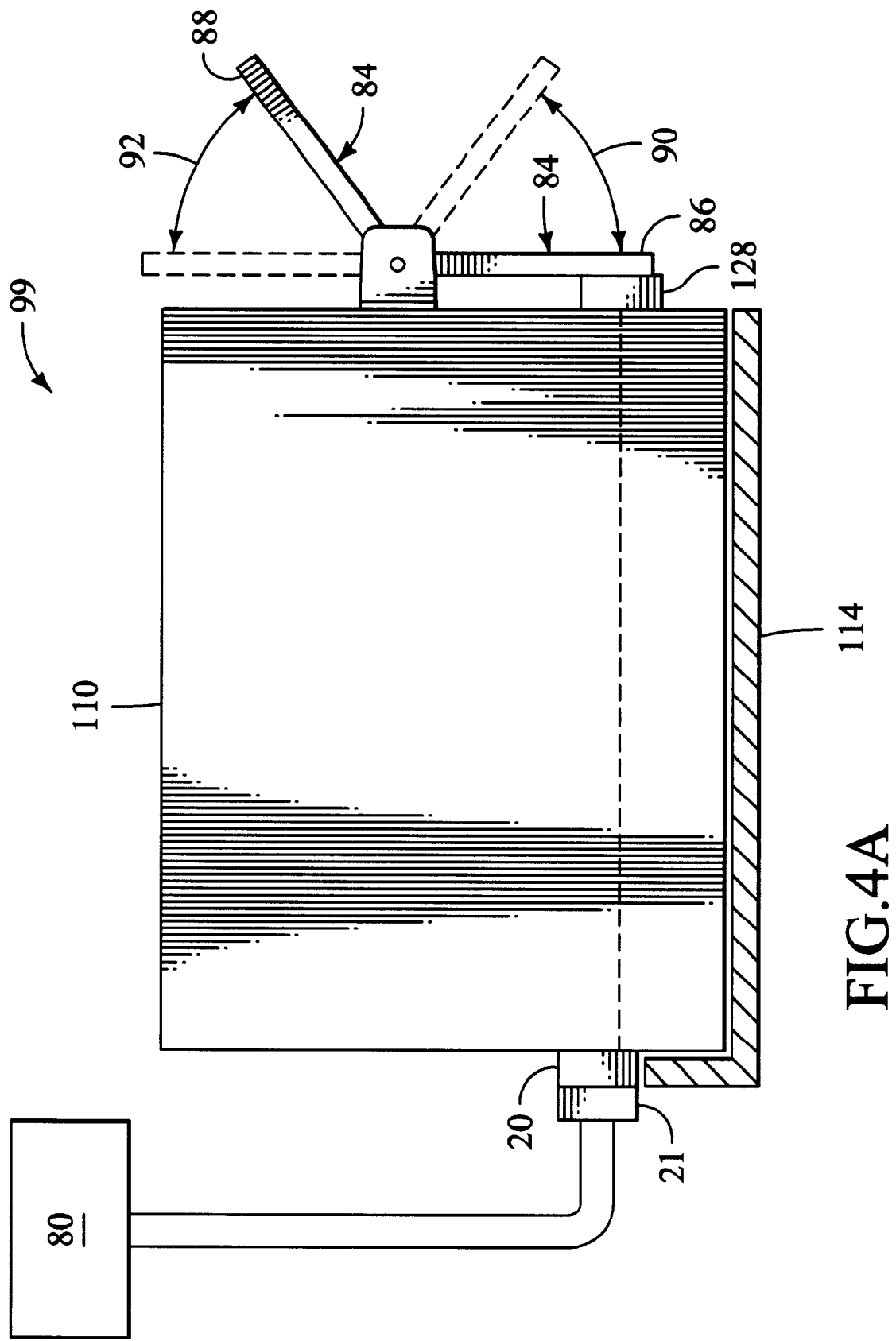
FIG. 4A is a schematic diagram of the present invention.

FIG. 4A is a schematic diagram of a module removal system 99 in accordance with the present invention. The system 99 includes a data processing device such as a controller 80 or the like which is in communication with a module 110. The module 110 is configured to be removably supported on a chassis 114 in a fully supported position. By "fully supported position" I mean the normal position of the module 110 on the chassis 114 during operation of the module, and wherein the module is electrically connected to the controller 80. The module 110 can be connected to the controller 80 by way of a coupling portions 20, 21 which are known in the art and which have been discussed above. The coupling portions 20, 21 enable the module 110 to be disconnected from the controller 80 when the module is removed from the chassis 114. The module 110 can be any of a number of devices, such as a disk drive, a power supply, and the like. The module 110 is generally configured to perform an internal operation while fully supported on the chassis 114. The operation performed by the module 110 can be any of a number of operations, such as processing, recording, or retrieving data.

Generally, termination of the operation of the module 110 is desirable prior to removal of the module from the chassis 114. Such termination of the operation of the module 110 can prevent, or minimize, inadvertent damage to one or more operational aspects of the module. For example, in the case of a disk drive, termination of the operation of the module 110 prior to removal from the chassis 114 can prevent inadvertent loss of data. Termination of the operation of the module 110 can include the initiation of a shut-down sequence. The shut-down sequence can facilitate preparation of the module 110 for removal and disconnection from the chassis 114.

The system 99 also includes a latch assembly 84. The latch assembly 84 can have any of a number of configurations, with a given latch assembly configuration a resulting in a given embodiment of the invention. Several such embodiments of the invention, each having a specific latch assembly configuration, shall be discussed in detail below. The latch assembly 84 can comprise a target portion 86 and an engagement portion 88. The target portion 86 can be configured to be movable through a first range of movement 90. Likewise, the engagement portion 88 can be configured to be movable through a second range of movement 92. The movement of the engagement portion 88 through the second range 92 causes removal of the module 82 from the fully supported position on the chassis 83. However, the position and movement of the target portion 86 can affect the movement of the engagement portion 88. For example, the latch assembly 84 can be configured such that movement of the engagement portion 84 through the second range 92 first requires a prior movement of the target portion 86 through the first range 90.

Additionally, the system 99 includes a sensor 128 which can be mounted on the module 110, and which can be configured to detect the movement, or position, of the target portion 86 through the first range 90. By "sensor" I mean any means of detecting the movement, or position, of the target portion 86. That is, "sensor" is meant to include electrical contacts, pneumatic and hydraulic switches, proximity sensors, photo-electric sensors, vibration sensors, cameras, motion detectors, RADAR, and SONAR, for example. The sensor 128 can be configured to generate a signal in response to, or as a result of, the movement of the target portion 86 through the first range 90. The sensor 94 can be further configured to communicate the signal to the controller 80. The controller 80 can, in response to the signal, initiate appropriate action in anticipation of the removal of the module 82 from the chassis 83. The action initiated by the controller 80 in response to the signal from the sensor 128 can include termination of the operation of the module 110, or initiation of a shut-down sequence.

Figure 5:
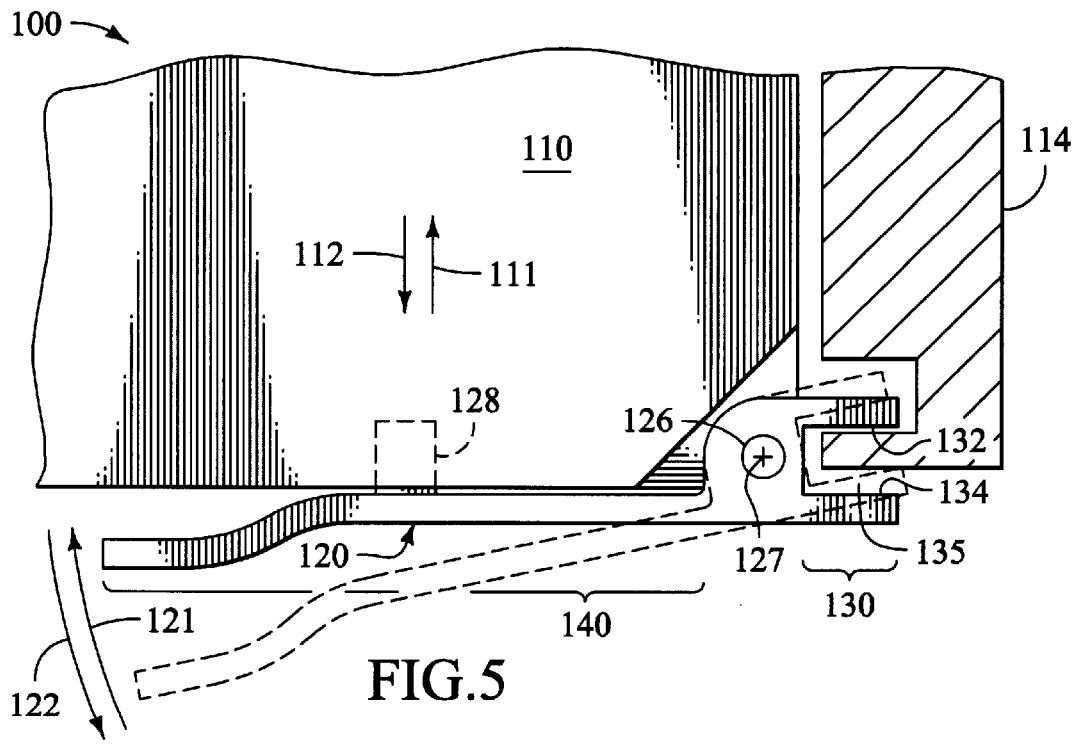
FIG. 5 is a top plan view of the apparatus depicted in FIG. 4, showing first and second positions of the latch assembly.
Figure 6:
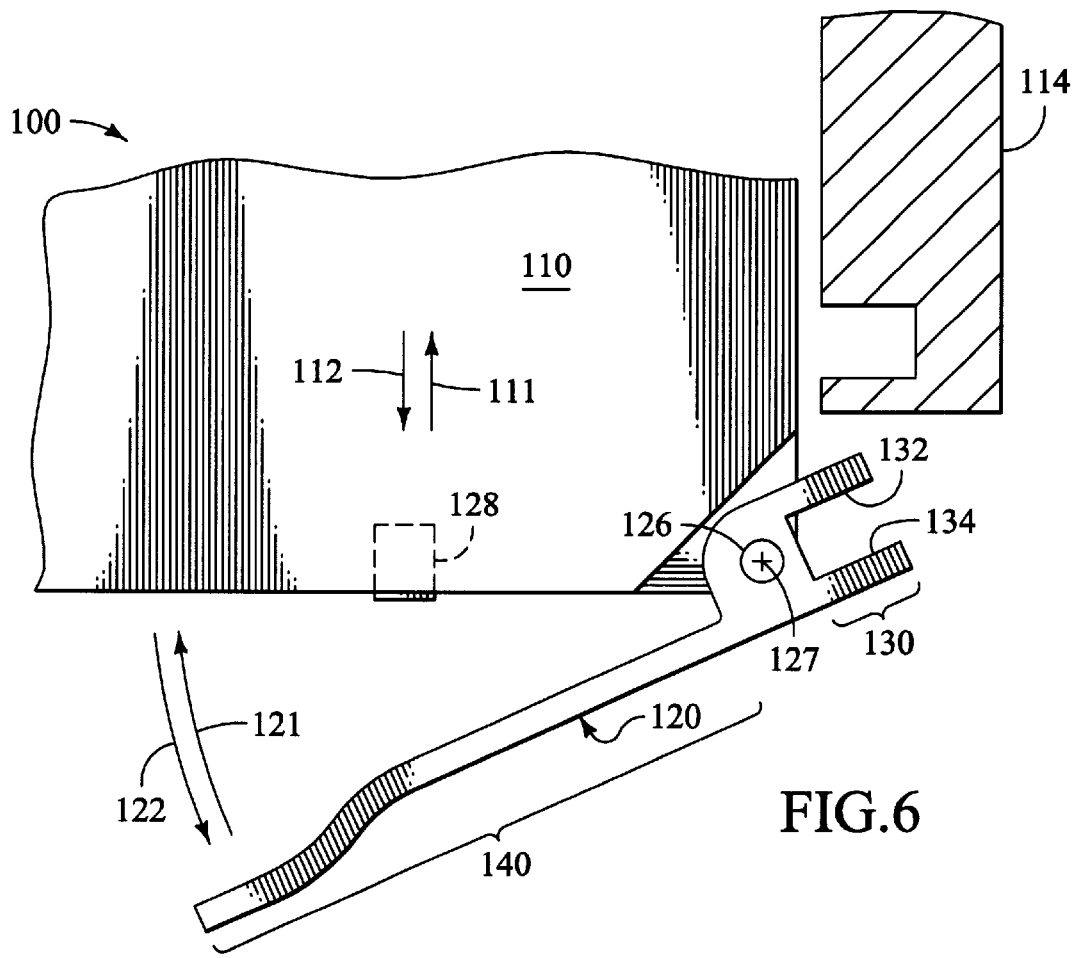
FIG. 6 is another top plan view of the apparatus depicted in FIG. 4 showing a third position of the latch assembly.

FIGS. 4 through 6 depict a portion of a module removal system 100 in accordance with a first embodiment of the present invention. FIG. 4 is a partial, exploded, perspective view of the system 100. The system 100 comprises a latch assembly 120 which is mounted on a module 110, and which is configured to move relative to the module. For example, the latch 120 can be rotatably mounted on the module 110 by way of a pin 126 as shown. The pin 126 provides an axis 127 about which the latch assembly 120 can rotate, or pivot, relative to the module 110. It is understood that the pin 126 can alternatively be configured as an integral portion of the latch assembly 120, or as an integral portion of the module 110.

The system 100 also comprises a sensor 128 which is shown mounted on the module 110. Although the sensor 128 can be located on the module 110 as shown, it is understood that the sensor 128 can be mounted in any of a number of possible locations, as well as on a number of possible objects. For example, the sensor 128 can alternatively be mounted on the latch assembly 120. The sensor 128 is configured to detect movement of the latch assembly 120.

Figure 1:
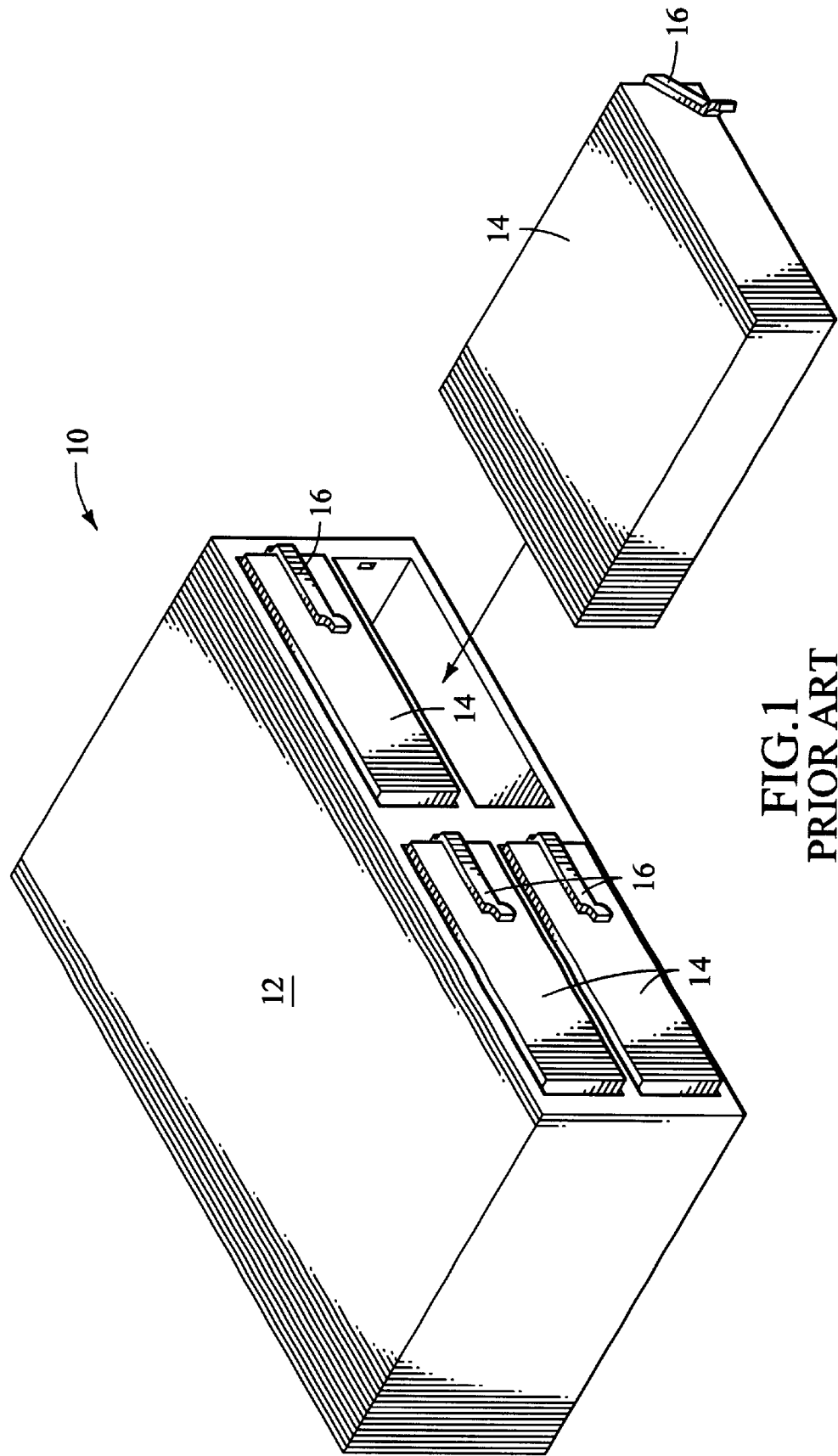
FIG. 1 is an exploded perspective view of a prior art device including a chassis and several modules.
Figure 2:
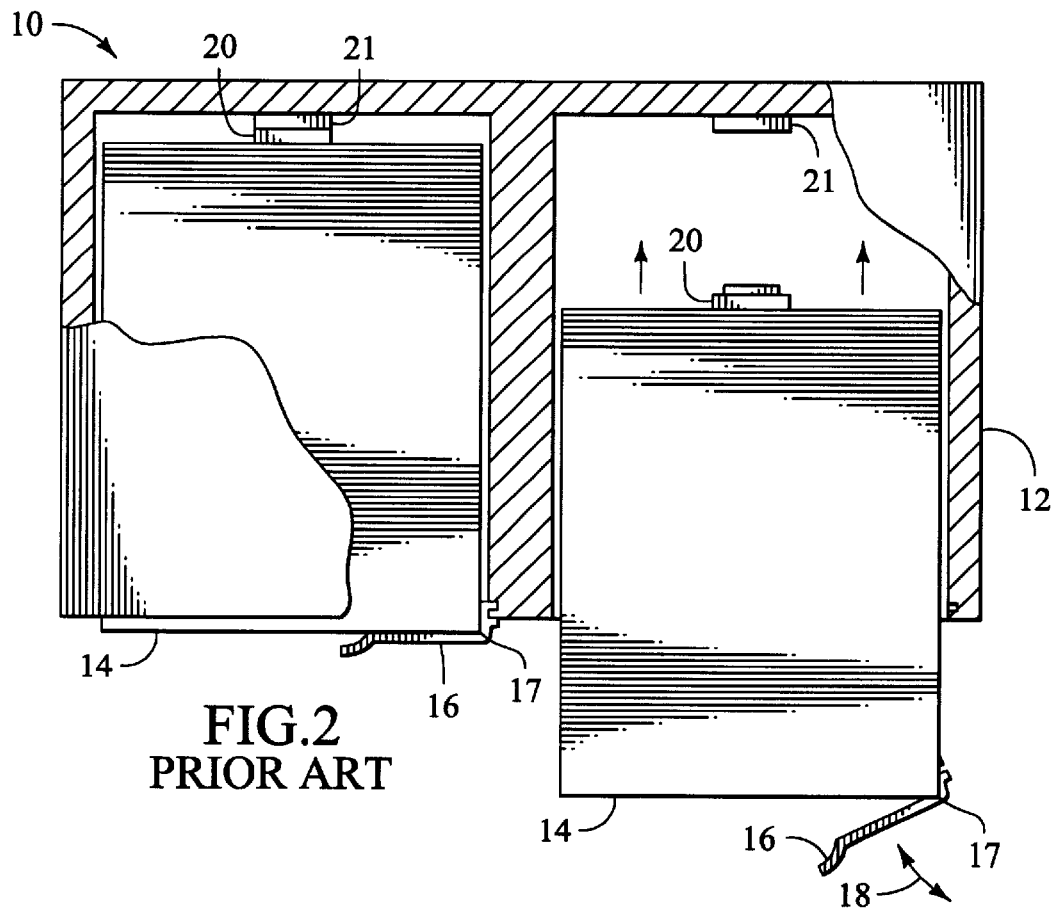
FIG. 2 is a top view of the prior art device shown in FIG. 1.
Figure 3:
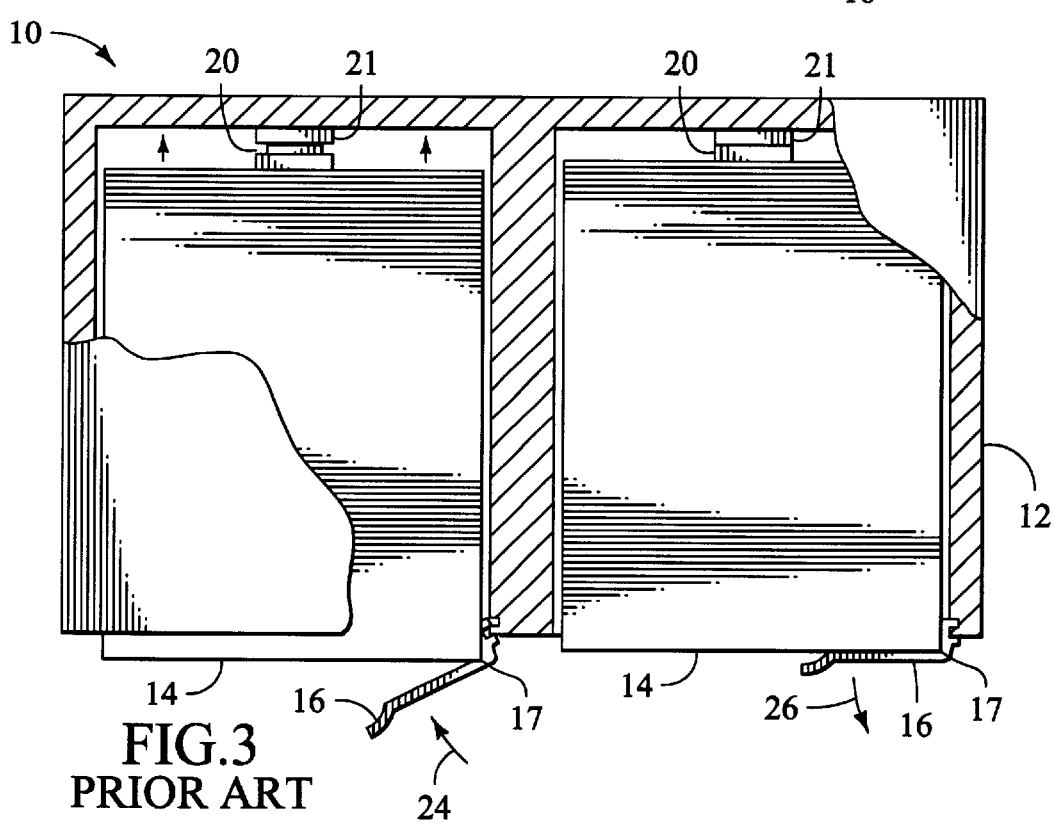
FIG. 3 is another top view of the prior art device shown in FIG. 1.

The sensor 128 can further be configured to generate a signal when it detects movement of the latch assembly 120. Both the sensor 128 and the module 110 can be in communication with a controller 80 as depicted in FIG. 4A Moving to FIG. 5, a partial top view is shown of the system 100 which is depicted in FIG. 4. However, in FIG. 5, the latch assembly 120 is shown assembled rather than exploded. As is seen, the system 100 is employed in conjunction with the module 110 which can be removably supported on a chassis 114. The module 110 is installed into the chassis 114 by movement of the module relative to the chassis in a direction indicated by the arrow 111. Conversely, the module 110 is removed from the chassis 114 by movement of the module 110 relative to the chassis 114 in a substantially opposite direction indicated by the arrow 112. The removably supportable nature of typical modules within typical chassis has been explained above for FIGS. 1 through 3. Furthermore, the nature of the electrical connections between typical modules and typical chassis by way of coupling portions has also been explained above for FIGS. 1 through 3. As shown in FIG. 5, the module 110 is fully supported on the chassis 114.

The latch 120 can comprise an engagement portion 130 and a target portion 140. Both the engagement portion 130 and the target portion 140 can be integrally defined on the latch assembly 120. That is, the engagement portion 130 and the target portion 140 can be the same component, as shown. Furthermore, a first surface 122 and a second surface 134 can be defined on the engagement portion 130. The first and second surfaces 132, 134 can be substantially parallel to one another. Also, the first and second surfaces 132, 134 can be in substantially parallel, laterally off-set, juxtaposed relation to one another as shown. It is evident that a gap 135 can be defined between the chassis 114 and the second surface 134.

The engagement portion 1110 can be configured to engage the chassis 114 as shown. More specifically, the engagement portion 130 can be configured to transmit a given force to the chassis 114 by contact with the chassis. The given force can be employed to aid in fully inserting the module 110 into the chassis 114. Alternatively, the given force can be employed to aid in removing the module 110 from the chassis 114.

The target portion 140 can be substantially elongated so as to be manually gripped and manipulated as a handle. Alternatively, the target portion 140 can be configured to be moved by an actuator (not shown) or the like. The pivot axis 127 can be located between the engagement portion 130 and the target portion 140, as shown. The latch assembly 120 can be configured so that the target portion 140 is substantially longer than the engagement portion 130, as shown. This configuration allows the latch assembly 120 to provide a "lever-action" when pivoted about the pivot axis 127.

The latch assembly 120 can be configured to pivot relative to the module 110 about the pivot axis 127 in a direction indicated by the arrow 121, and in a substantially opposite direction indicated by the arrow 122. The latch assembly 120 is positionable in a first position as shown in solid lines in FIG. 5. That is, the latch assembly 120 can be located in a given position relative to the module 110. This given position of the latch assembly 120 can be called the first position. It is noted that when the latch assembly 120 is in the first position, the target portion 140 can be substantially proximate to the sensor 128. That is, when the latch assembly 120 is in the first position, the sensor 128 can detect the presence of the target portion 140. More specifically, the sensor 128 can be configured to detect the presence of the target portion 140 when the latch assembly 120 is in the first position. It is also noted that when in the first position, the latch assembly 120 is engaged with the chassis 114 and the module 110 is fully supported on the chassis. In an alternative configuration which is not shown, the latch assembly 120 can be resiliently biased toward the first position by way of at least one resilient member (not shown) such as a spring, or the like.

Still referring to FIG. 5, the latch assembly 120 can be moved to a second position which is shown in dashed lines. That is, as is seen, the latch assembly 120 can be pivoted, or rotated in the direction 122 to the second position shown in dashed lines. The range of movement of the target portion 140 between the first position of the latch assembly 120, shown in solid lines, and the second position, shown in dashed lines, can be defined as the first range of movement. It is noted that, even though the target portion 140 can be moved through the first range, the module 110 is not substantially moved relative to the chassis 114. That is, the module 110 remains fully supported within the chassis 114 even though the target portion 140 is moved through the first range. However, sensor 128 can detect movement of the target portion 140 through the first range because, for example, the target portion is moved away from the sensor 128 when the target portion is moved through the first range. Thus, the sensor 128 can detect the movement of the target portion 140 through the first range before the latch assembly 120 causes movement of the module 110 from the fully supported position on the chassis 114.

As shown in FIG. 5, when the latch assembly 120 is in the second position, the second surface 134 is just barely in contact with the chassis 114. It is evident that, should the target portion 140 be moved any further in the direction 121 from the second position, the second surface 134 will bear against the chassis 114 and will tend to urge the module 110 in the direction 111. However, it is noted that the sensor 128 can detect movement of the target portion 140 through the first range and to the second position before the second surface 134 causes movement of the chassis 114. The significance of this will become apparent in later discussion.

Moving to FIG. 6, the latch assembly 120 is shown in a third position. The range of movement of the engagement portion 130 from the second position of the latch assembly 120, shown in dashed lines in FIG. 5, to the third position, shown in FIG. 6, can be defined as the second range of movement. It is evident that movement of the latch assembly 120 from the second position to the third position will caused the second surface 134 to bear against the chassis 114 with sufficient force to urge the module 110 in the first direction 111 relative to the chassis. In other words, movement of the engagement portion 130 through the second range will cause the module 110 to be moved from its fully supported position on the chassis 114.

A review of FIGS. 5 and 6 will reveal that the first range of movement occurs prior to the second range of movement when the module 110 is removed from its fully supported position. That is, the sensor 128 can detect the movement of the target portion 140 through the first range before the engagement portion 130 moves through the second range. The latch assembly 120 causes movement of the module 110 relative to the chassis 114 when the engagement portion 130 moves through the second range. However, the latch assembly 120 causes substantially no movement of the module 110 when the target portion 140 moves through the first range. Thus, by detecting movement of the target portion 140 through the first range, the sensor 128 can send a signal to the controller 80 which is shown in FIG. 4A. Because movement of the target portion 140 through the first range occurs prior to the movement of the engagement portion 130 through the second range, the signal can be sent by the sensor before movement of the engagement portion 130 through the second range. Thus, the controller 80 (shown in FIG. 4A) can, in response to the signal sent by the sensor, terminate the operation of the module 110 in anticipation of the removal of the module from the chassis 114. As discussed above, termination of the operation of the module 110 can include any number of possibly actions, including initiating a shut-down sequence of the module.

As also discussed above, termination of the operation of the module 110 prior to movement of the module relative to the chassis 114 can be beneficial in preventing unexpected interruption of the operation of the module. This, in turn, can prevent undesirable affects on the module 110 due to the movement of the module relative to the chassis 114. For example, as previously discussed, movement of the module 110 with respect to the chassis 114 can create electrical noise which can cause undesirable affects. Furthermore, unexpected electrical disconnection of the module 110 from the chassis 114 during operation of the module can result in further undesirable affects. As seen, the apparatus 100 in accordance with the first embodiment of the present invention can be employed to substantially prevent these undesirable affects on the operation of the module 110.

Referring to FIGS. 5 and 6, it is seen that, if the latch 120 is engaged with the chassis 114 and is moved back toward the first position by movement of the target portion 140 in the direction 122, then the first surface 132 will come into contact with the chassis 114. Continued movement of the target portion 140 in the direction 122 will cause the latch assembly 120 to move the module 110 relative to the chassis in the direction 112. This will result in the module 110 becoming fully supported on the chassis 114.

Figure 7:
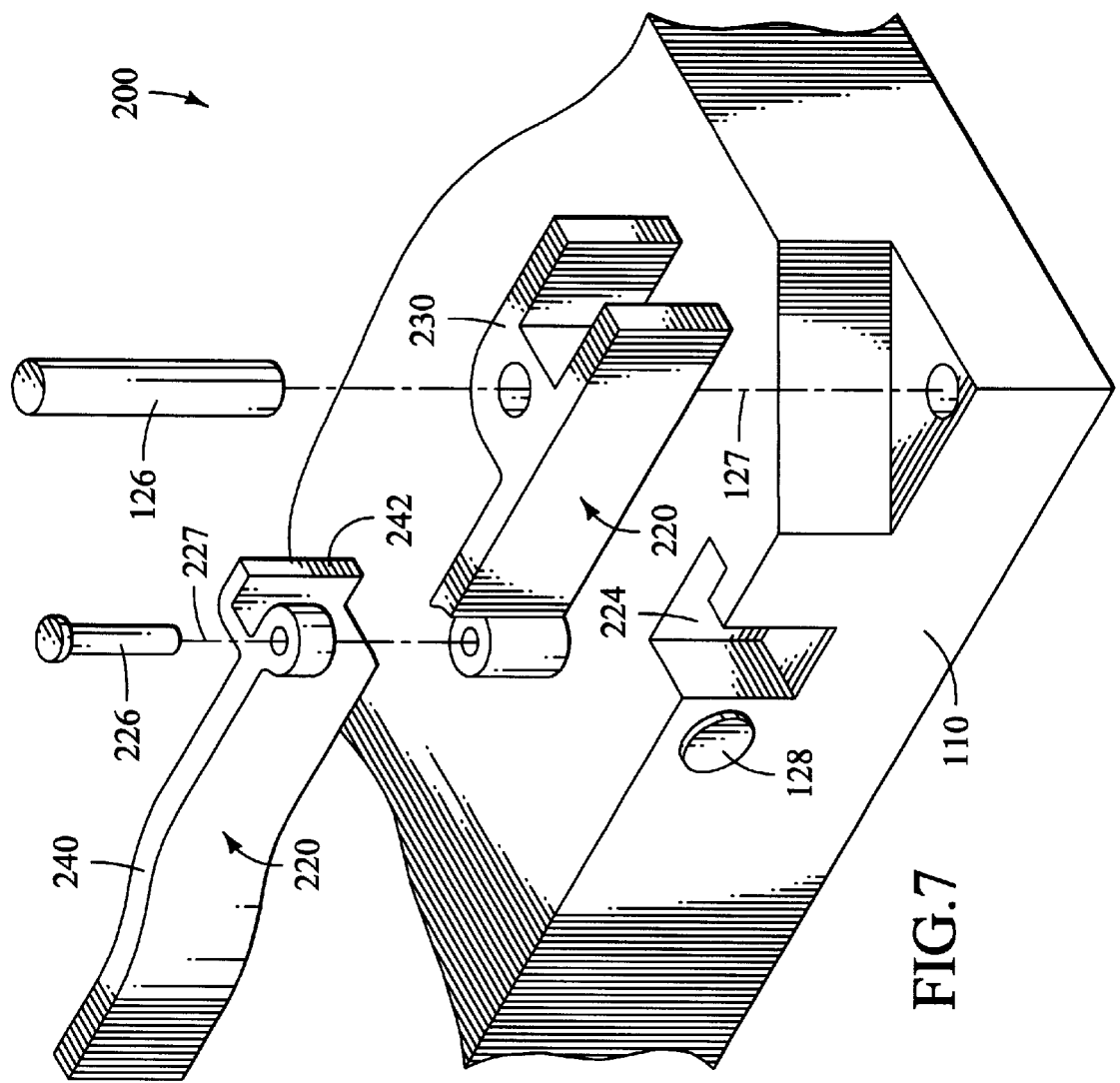
FIG. 7 in an exploded, partial perspective view of a latch assembly in accordance with a second embodiment of the present invention.
Figure 8:
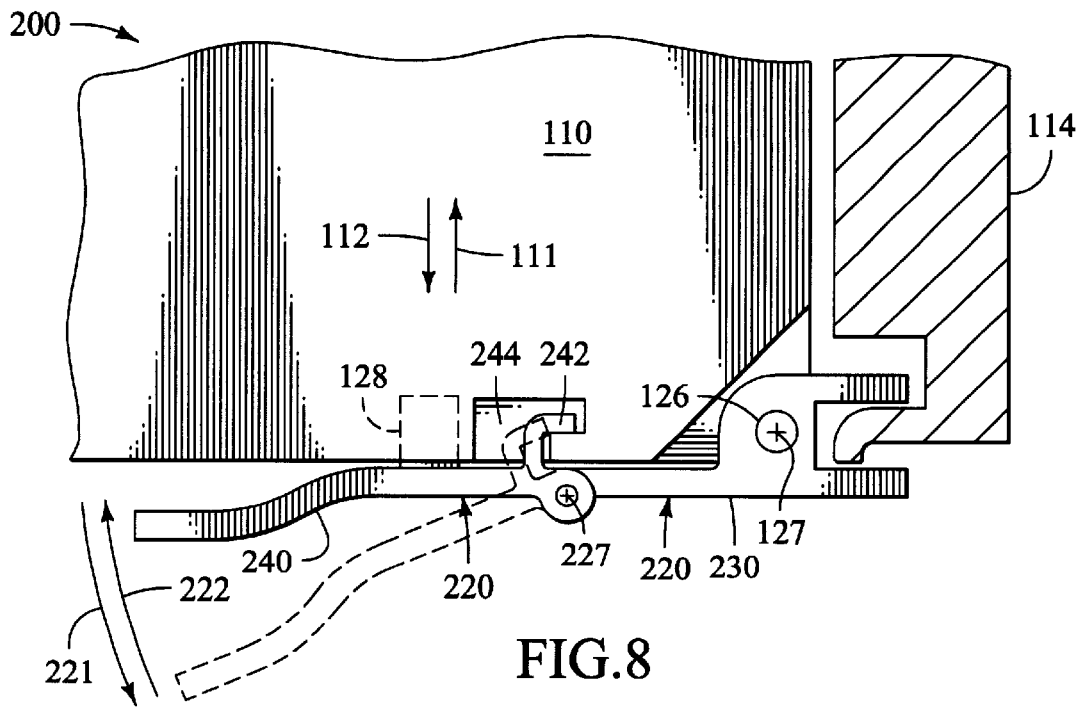
FIG. 8 is a top plan view of the apparatus depicted in FIG. 7, showing first and second positions of the latch assembly.
Figure 9:
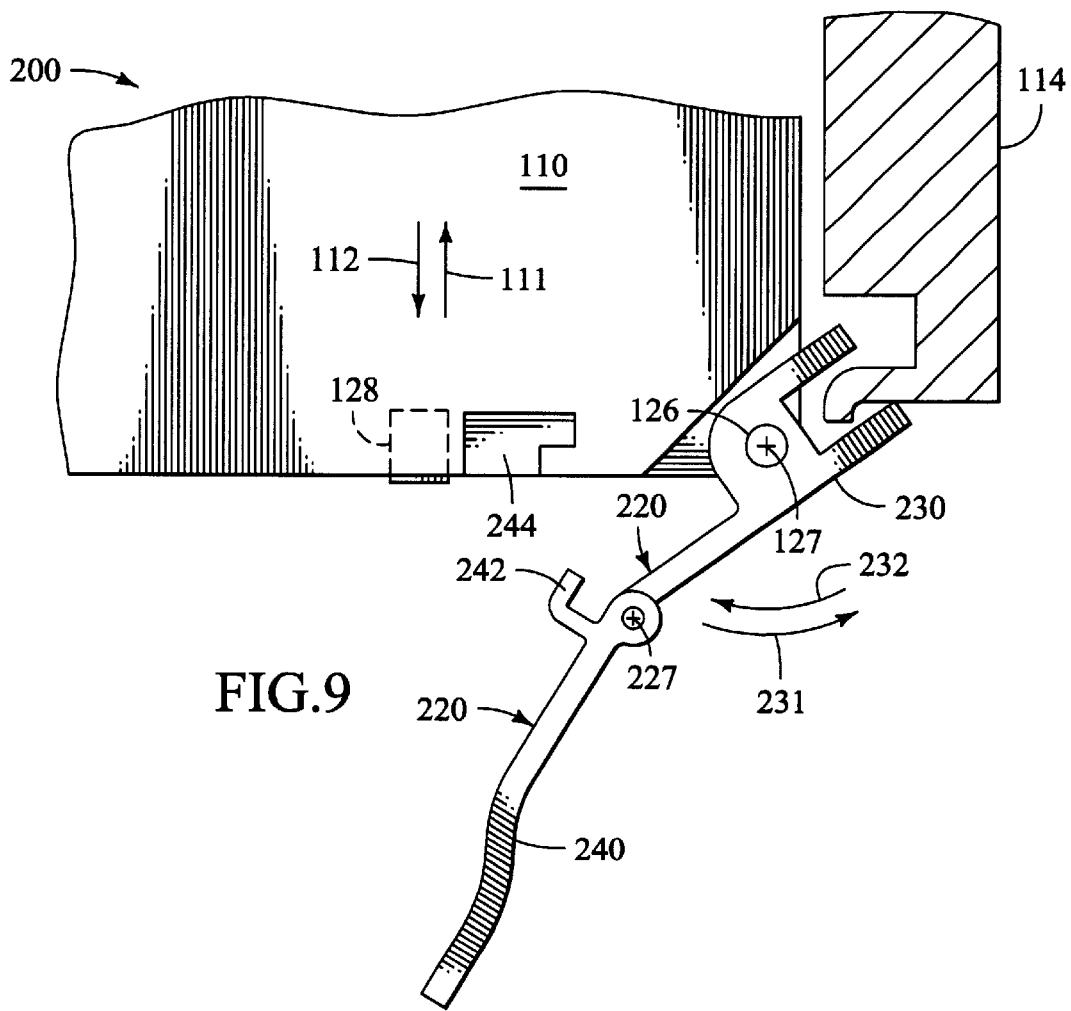
FIG. 9 is another top plan view of the apparatus depicted in FIG. 7, showing a third position of the latch assembly.

Moving now to FIGS. 7 through 9, a module removal system 200 is shown in accordance with a second embodiment of the present invention. FIG. 7 is a partial, exploded perspective view of the system 200. From FIG. 7 it is seen that the system 200 comprises a latch assembly 220 which is movably mounted on a module 110. The system 200 also comprises a sensor 128 which can be mounted on the module 110, although other locations and mountings of the sensor are possible as discussed above for FIGS. 4 through 6. The sensor 128 can be configured to detect movement, or position, of the latch assembly 220. The latch assembly 220 can be rotatably mounted on the module 110 as shown by way of a pivot pin 126. A pivot axis 127 is defined on the pivot pin. The pivot pin 126 can, in the alternative, be configured to be integral with the latch, or integral with the module.

The latch 220 can comprise an engagement portion 230 which is mounted on the module 110 and which is configured to pivot with respect to the module about the pivot axis 127. The latch 220 can also comprise a target portion 240 which is rotatably mounted on the engagement portion 230 by way of a secondary pin 226. As is seen, the engagement portion 130 and the target portion 140 can be separate components. A secondary pivot axis 227 is defined on the secondary pin 226. Thus, the target portion 240 is configured to rotate relative to the engagement portion 230 about the secondary pivot axis 227. As is seen, the pivot axis 127 and the secondary pivot axis 227 can be substantially parallel to one another. The target portion 240 can comprise a lock member 242 which is mounted on the target portion, and which extends therefrom. A lock chamber 244 can be defined on the module 110. The lock member 242 can be configured to matingly engage the lock chamber 244.

Moving to FIG. 8, a partial top view is shown of the system 200 which is depicted in FIG. 7. However, in FIG. 8 the latch assembly 220 is shown fully assembled rather than exploded as in FIG. 7. As is seen in FIG. 8, the latch assembly 220 is movably mounted on the module 110. The latch assembly 220 can be configured to pivot relative to the module 110 about the pivot axis 127. The latch assembly 220 can comprise an engagement portion 230, which is movably mounted on the module 110, and a target portion 240 which is movably mounted on the engagement portion. It is evident that the target portion 240 can rotate relative to the engagement portion 230 about the secondary pivot axis 227, both in a direction indicated by the arrow 221, and in a substantially opposite direction indicated by the arrow 222.

As shown in FIG. 8, the module 110 is fully installed on the chassis 114. Various points regarding the installation of the module 110 into, and removal of the module from, the chassis 114, in addition to the electrical connection there between by way of couplings, have been discussed above. The module 110 is removed from the chassis 114 by movement of the module 110 in the direction 111. Conversely, the module is installed into the chassis 114 by movement of the module 110 in the direction 112. The latch assembly 220 can be configured to be fully engaged with the chassis 114 when the module 110 is fully supported in the chassis, as shown. It is evident that, when the latch assembly 220 is fully engaged with the chassis 114, the module 110 is substantially immobilized relative to the chassis.

The latch assembly 220 is positionable in a first position relative to the module 110, which is shown in solid lines in FIG. 8. It is noted that, when the latch assembly 220 is in the first position, the module 110 is fully supported in the chassis 114. Also, when in the home position, the engagement portion 230 is substantially fully engaged with the chassis 114 as shown. It is evident that the module 110 cannot be moved relative to the chassis 114 without corresponding rotation of the engagement portion 230. As mentioned above, a lock member 242 can be mounted on the target portion 240. The lock member 242 can be engaged with the module 110 by way of the lock chamber 244 which can be defined in the module. In an alternative configuration which is not shown, the latch assembly 220 can be configured to be resiliently biased toward the first position by at least one resilient member such as a spring (not shown), or the like.

It is noted that, when the latch assembly 220 is in the first position, the lock member 242 is fully engaged with the module 110 by way of the lock chamber 244 as shown. It is evident that the engagement of the lock member 242 with the module 110, when the latch assembly 220 is in the first position, prevents movement of the engagement portion 230 relative to the module 110. That is, when the latch assembly 220 is in the first position, the engagement of the lock member 242 with the module 110 substantially immobilizes the engagement portion 230 relative to the module 110. It is evident, then, that because the engagement portion 230 is fully engaged with the chassis 114, the module 110 is substantially immobilized relative to the chassis when the latch assembly 220 is in the first position. It is also evident that, when the latch 220 is located in the first position, the sensor 128 can detect the presence of the latch 220 in the first position because the handle portion 240 is proximate to the sensor. Thus, the sensor 128 can detect the movement, or position, of the target portion 240 when the latch assembly 220 is in the first position.

Still referring to FIG. 8, it is evident that the target portion 240 can be rotated in the direction 221 so that the latch assembly 220 has been moved from the first position (which is shown in solid lines) to a second position which is shown in dashed lines. The range of movement of the target portion between the first position to the second position can be defined as the first range of movement. It is noted that, when the latch assembly 220 is rotated to the second position from the first position, the lock member 242 becomes disengaged from the module 110 by way of the lock chamber 244. In other words, the lock member 242 will become disengaged from the module 110 because the target portion 240 is rotated through the first range to the second position. Furthermore, if the target portion 240 is rotated from the first position to the second position, the engagement portion 230 will no longer be immobilized by the engagement of the lock member 242 with the lock chamber 244. It is evident, then, that the engagement portion 230 can be rotated about the pivot axis 127 in the direction 231 when the latch assembly 220 is in the second position, buy cannot be so rotated when the latch assembly is in the first position. It is also evident that movement of the engagement portion 230 in the direction 231 will cause the engagement portion to transmit a given force to the chassis 114, which will urge the module 110 in the direction 111 relative to the chassis. In other words, when the engagement portion 230 is moved in the direction 231, the engagement portion will act to move the module 110 from its fully supported position in the chassis 114.

When the target portion 240 is rotated through the first range from the first position to the second position, the sensor 128 can detect the movement, or position, of the target portion. In other words, the sensor 128 can detect movement of the target portion 240 through the first range. It is noted that the sensor 128 can detect movement of the target portion 240 through the first range before the lock member 242 becomes fully disengaged from the lock chamber 244. As discussed above, the engagement portion 230 is substantially immobilized until the lock member 242 is fully disengaged from the lock chamber 244. Also, the module 110 is substantially immobilized relative to the chassis 114 while the lock member 242 is engaged with the lock chamber 244. Thus, the sensor 128 can detect the movement of the target portion 240 through the first range before the latch assembly 220 causes movement of the module 110 relative to the chassis 114.

Moving now to FIG. 9, it is evident that the latch assembly 220 can be moved from the second position (which is shown in dashed lines in FIG. 8) to a third position relative to the module 110. It is also evident that, in moving from the second position to the third position, the engagement portion 230 rotates in the direction 231 about the pivot axis 127. This range of movement of the engagement portion 230 from the second position to the third position can be defined as the second range of movement. As is seen, the movement of the engagement portion 240 through the second range causes the engagement portion to urge the module 110 in the first direction 111 and away from the fully supported position. However, as discussed above, the sensor 128 can detect the movement of the target portion 240 through the first range before the engagement portion 230 moves through the second range. Thus, the sensor 128 can generate a signal in response to the target portion 240 moving through the first range.

In this manner, the system 200 can be beneficially employed to minimized undesirable effects caused by inadvertent, or unexpected, movement of the module 110 with respect to the chassis 114. Such undesirable effects have been discussed above. Specifically, the sensor 128 can be configured to send a signal to the controller 80 (which is shown in FIG. 4A) when the sensor detects movement of the target portion 240 through the first range. When the latch assembly 220 is in the first position, and when the module 110 is fully supported in the chassis 114, movement of the module relative to the chassis is substantially prevented. Accordingly, when the sensor 128 detects movement of the target portion 240 through the first range, the signal sent by the sensor 128 can alert the controller 80 (which is shown in FIG. 4A) that movement of the module 110 relative to the chassis 114 is imminent. Moreover, the engagement of the lock member 242 with the module 110 by way of the lock chamber 244 substantially prevents inadvertent movement of the module relative to the chassis 114 when the latch assembly 220 is in the first position.

Also from FIGS. 8 and 9, it is seen that the engagement portion 230 can be rotated from the third position in the direction 232. Rotation of the engagement portion 230 in the second direction 232 from the third position will cause the engagement portion to transmit a given force to the chassis 114 so as to urge the module 110 relative to the chassis 114 in the direction 112. When the engagement portion 230 is rotated fully in the direction 232, the module 110 will be substantially fully supported on the chassis 114. The target portion 240 can then be rotated in the direction 222 from the second position toward the first position. When the target portion 240 is fully rotated in the direction 222, the latch assembly 220 will be in the first position. When the latch 220 reaches the first position, the lock member 242 will be fully engaged with the lock chamber 244.

Figure 10:
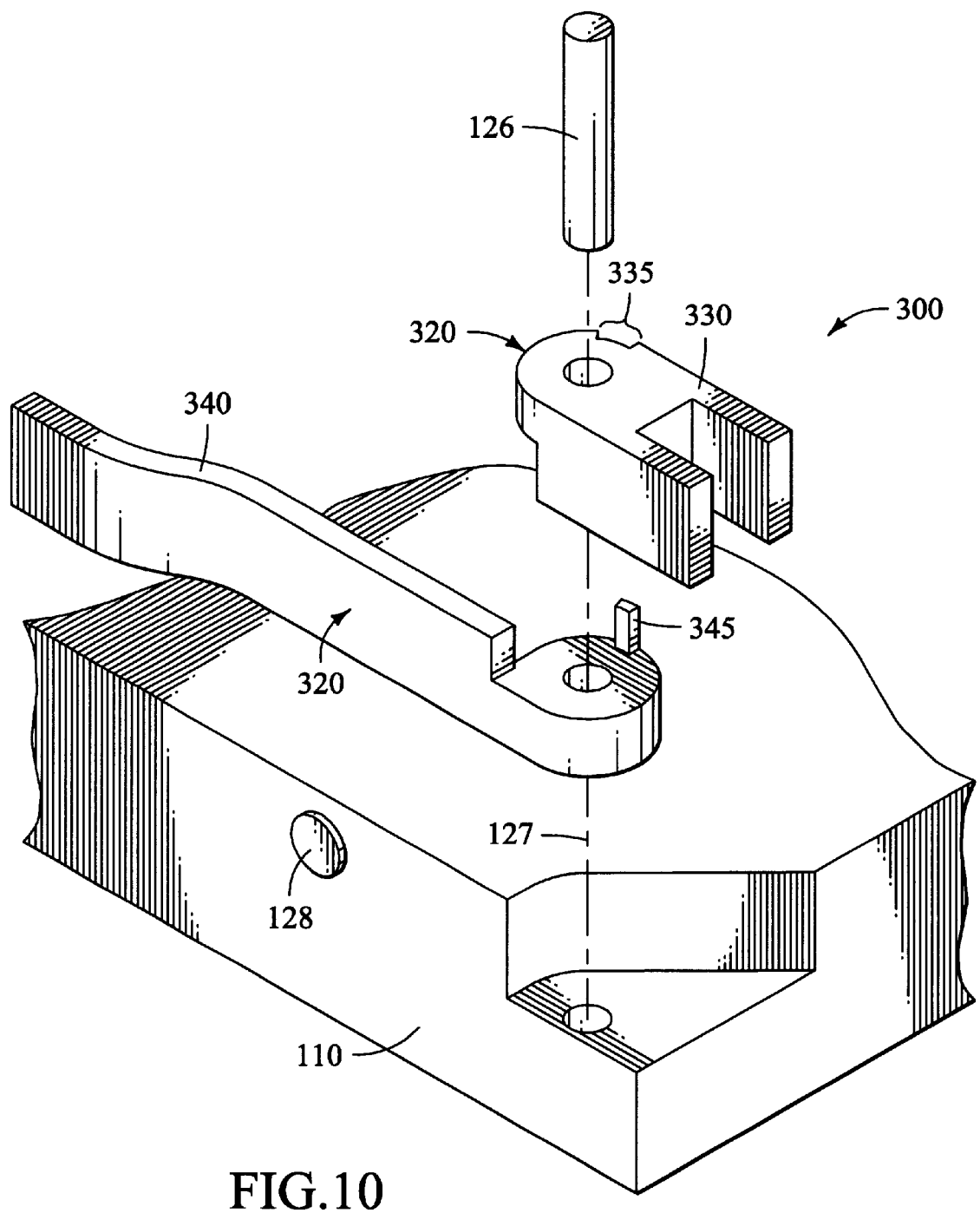
FIG. 10 is an exploded, partial perspective view of a latch assembly in accordance with a third embodiment of the present invention.
Figure 11:
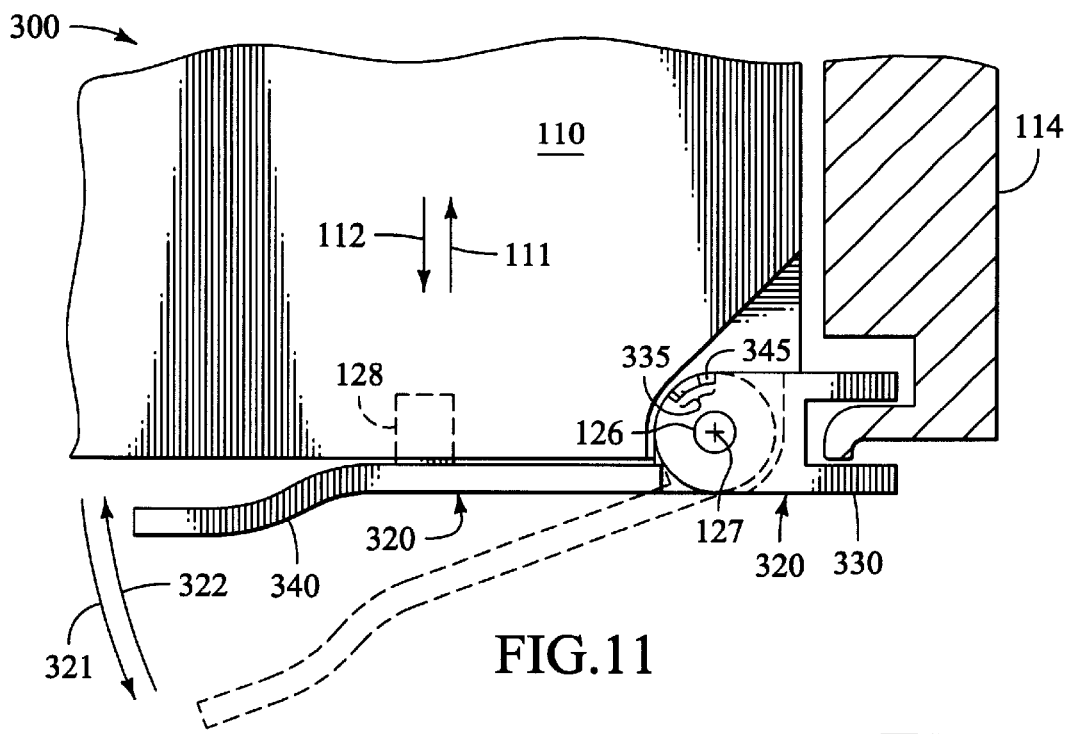
FIG. 11 is a top plan view of the apparatus depicted in FIG. 10, showing first and second positions of the latch assembly.
Figure 12:
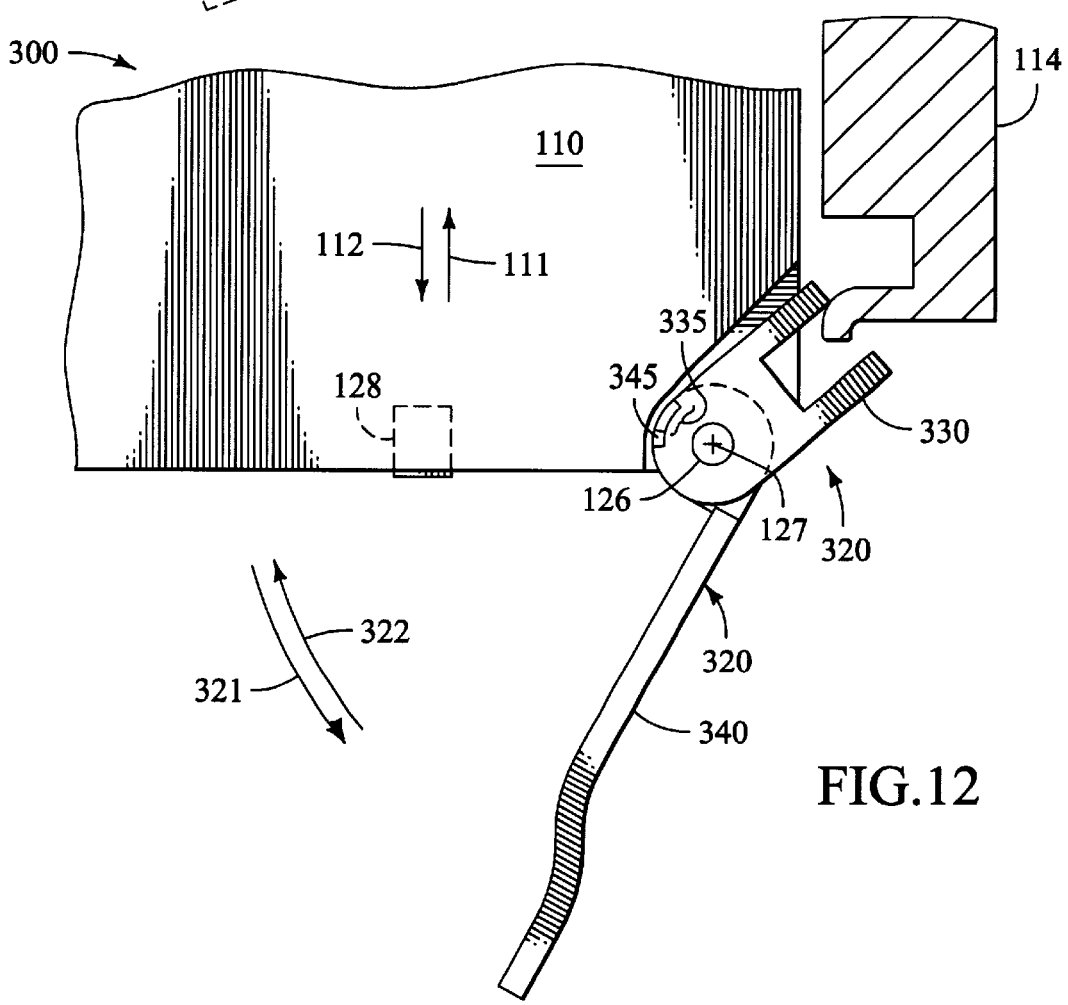
FIG. 12 is another top plan view of the apparatus depicted in FIG. 10, showing a third position of the latch assembly.

Moving now to FIGS. 10 through 12, a system 300 is shown in accordance with a third embodiment of the present invention. FIG. 10 is an exploded, partial perspective view of the apparatus 300. As is seen, the apparatus 300 comprises a latch assembly 320 which is movably mounted on a module 110. The latch assembly 320 can be rotatably mounted on the module 110 by way of a pivot pin 126, in which case the latch assembly is rotatable about an axis 127. The system 300 also comprises a sensor 128 which is mounted on the module 110 and which is configured to detect movement, or position, of the latch assembly 320. It is understood that the sensor 128 can be mounted in alternative locations (not shown), such as on the latch assembly 320, or chassis 114.

The latch assembly 320 comprises a target portion 340 which is mounted on the module 110 and which is configured to pivot relative to the module about the pivot axis 127. The target portion 340 can be substantially elongated as shown. The latch 320 also comprises an engagement portion 330 which is mounted on the module 110 and which is configured to pivot relative to the module about the pivot axis 127. It is evident that the pivot pin 126 can alternatively be made integral with the module 110, the target portion 340, or the engagement portion 330. An examination of FIG. 10 will reveal a circumferential slot 335 which is defined on the engagement portion 330. An axial projection 345 is also defined on the target portion 340. It is evident that, when the target portion 340 and the engagement portion 330 are mounted on the module 110, the projection 345 extends into the slot 335.

Moving to FIG. 11, a partial top view of the system 300 is shown. It is seen that the module 110 is removably supportably in a chassis 114 as discussed above. Moreover, the module 110 is shown fully supported on the chassis 114, as shown. The module 110 can be removed from the chassis 114 by movement of the module relative to the chassis in the direction 111. Likewise, the module 110 can be installed into the chassis 114 by movement of the module relative to the chassis in the direction 112. It is also seen that the latch 330 comprises a target portion 340 and an engagement portion 330. Both the target portion 340 and the engagement portion 330 are rotatably mounted on the module 110 about a common pivot axis 127.

The axial projection 345, which is defined on the target portion 340, projects axially into the circumferential slot 335. The axial projection 345 is circumferentially movable within the circumferential slot 335, and is movably contained by the slot to limit movement of the engagement portion 330 relative to the target portion 345. In other words, the target portion 340 is movable relative to the engagement portion 330, but that movement is limited to a given range which is defined by the movement of the projection 345 within the slot 335. Although the projection 345 is shown as defined on the target portion 340, and the slot 335 is shown as defined on the engagement portion 330, it is understood that this configuration can, in the alternative, be reversed. That is, the slot 335 can alternatively be defined on the target portion 340, and the projection 345 can alternatively be defined on the engagement portion 330. Furthermore, it is understood that other configurations, which are not shown, can be employed to accomplish substantially the same result of limiting the movement of the target portion 340 and engagement portion 330 relative to one another.

The latch assembly 320 can be positioned in a first position which is depicted by solid lines. In the first position, the target portion 340 is proximate to the sensor 128, and the engagement portion 330 is fully engaged with the chassis 114. It is noted that the target portion 340 and the engagement portion 330 can be substantially aligned when in the first position. In an alternative configuration which is not shown, both the target portion 340 and the engagement portion 330 can be resiliently biased toward the first position by way of respective resiliently biased members (not shown) such as springs or the like. It is noted that relative movements of the module 110, chassis 114, and engagement member 330 are similar to those discussed for FIGS. 7 through 9 above. It is evident also, that the target portion 340 can be rotated about the pivot axis 127 in a direction 321 to a second position which is indicated by dashed lines. If the target portion 340 is rotated in this manner, the engagement portion 330 can remain in its fully engaged position. This is because the projection 345 will move within the slot 335 as the target portion 340 is moved.

The range of movement of the target portion 340 between the first position and the second position can be defined as the first range of movement. It is also seen that the axial projection 345 can move within the circumferential slot 335 when the target portion 340 and the engagement portion 330 move relative to one another. It is evident that further movement of the target portion 340 relative to the engagement portion 330 in the direction 321 past the second position is prevented by contact of the axial projection 345 with the engagement portion. It is noted that, as shown, the target portion 340 is no longer aligned with the engagement portion 330 when the latch assembly is in the second position. It is evident that such further movement of the target portion 340 in the first direction 321 will result in rotation of the engagement portion 330 in the direction 321. It is also evident that the sensor 128 can detect the movement of the target portion 340 through the first range.

Moving to FIG. 12, it is seen that the target portion 340 can be moved further yet in the direction 321 beyond the second position. Such movement of the target portion 340 can cause the engagement portion 330 to also rotate in the direction 321. This rotation of the engagement portion 330 and the target portion 340 has caused the latch assembly 320 to move from the second position (shown in dashed lines in FIG. 11) to a third position which is shown in FIG. 12. The range of movement of the engagement portion 320 from the second position to the third position can be defined as the second range of movement. It is evident that movement of the engagement portion 330 through the second range causes the module 110 to be urged out of its fully supported position on the chassis 114. However, the sensor 128 can detect the movement of the target portion 340 through the first range before the engagement portion 330 moves through the second range. Thus, it is evident that the sensor 128 can detect movement of the target portion 340 through the first range before the module 110 is moved from its fully supported position by the movement of the engagement portion 330 through the second range.

A review of FIGS. 10 through 12 will reveal that, during installation of the module 110 into its fully supported position on the chassis, the target portion 340 can be moved in the direction 322 back toward the first position. This can cause the target portion 340 and the engagement portion 330 to again become substantially aligned with one another. Further movement of the target portion 340 in the direction 322 will cause rotation of the engagement portion 330 in the direction 322. This rotation of the engagement portion 330 in the direction 322 will cause the module 110 to move into the chassis 114 in the direction 112. Further movement of the target portion 340 in the direction 322 will be prevented once the latch assembly 320 again reaches the first position. The beneficial use of the system 300 is apparent in light of the above discussions in regard to the benefits of the embodiments depicted in FIGS. 4 through 9.

Figure 13:
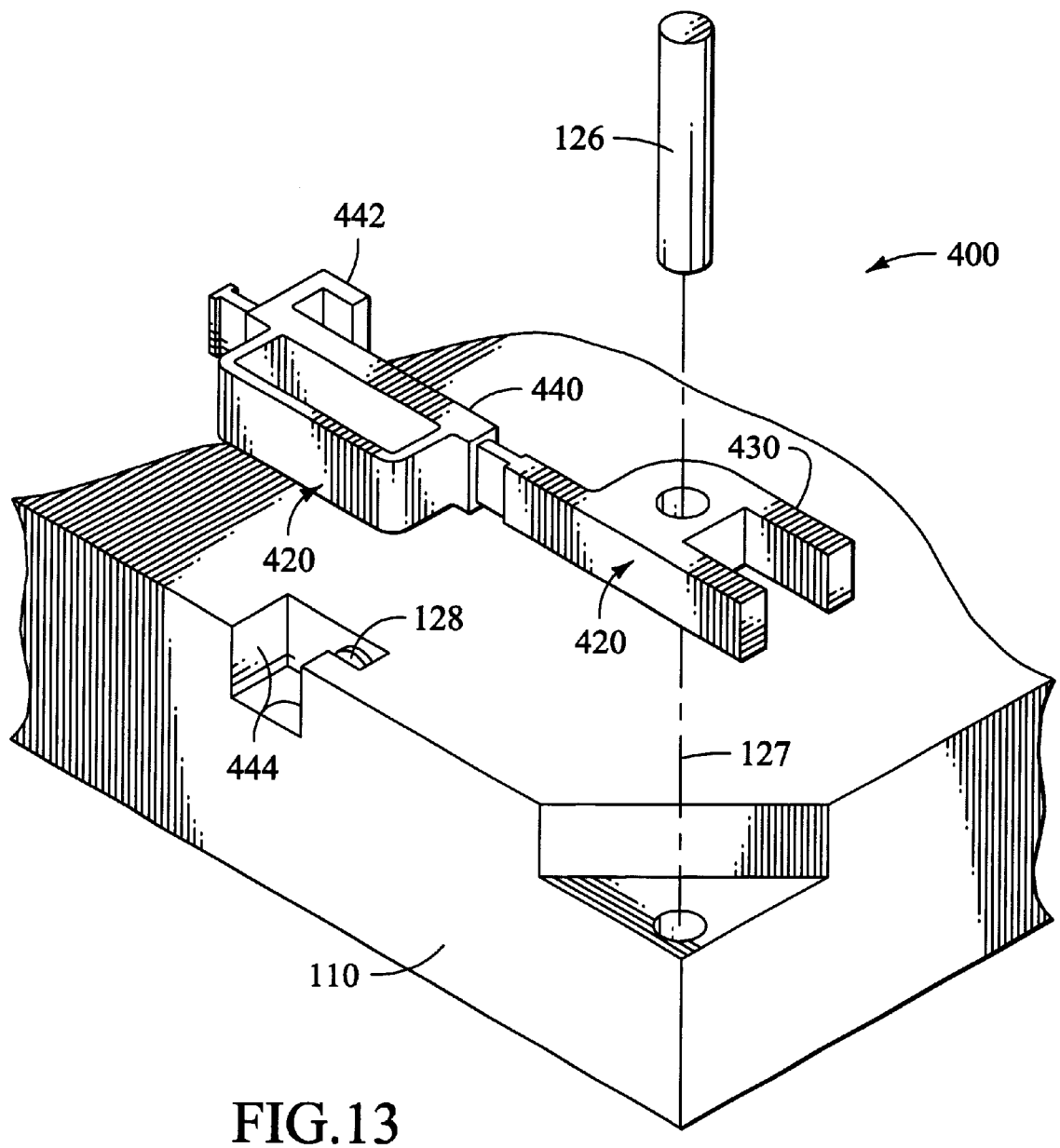
FIG. 13 is an exploded, partial perspective view of a latch assembly in accordance with a fourth embodiment of the present invention.
Figure 14:
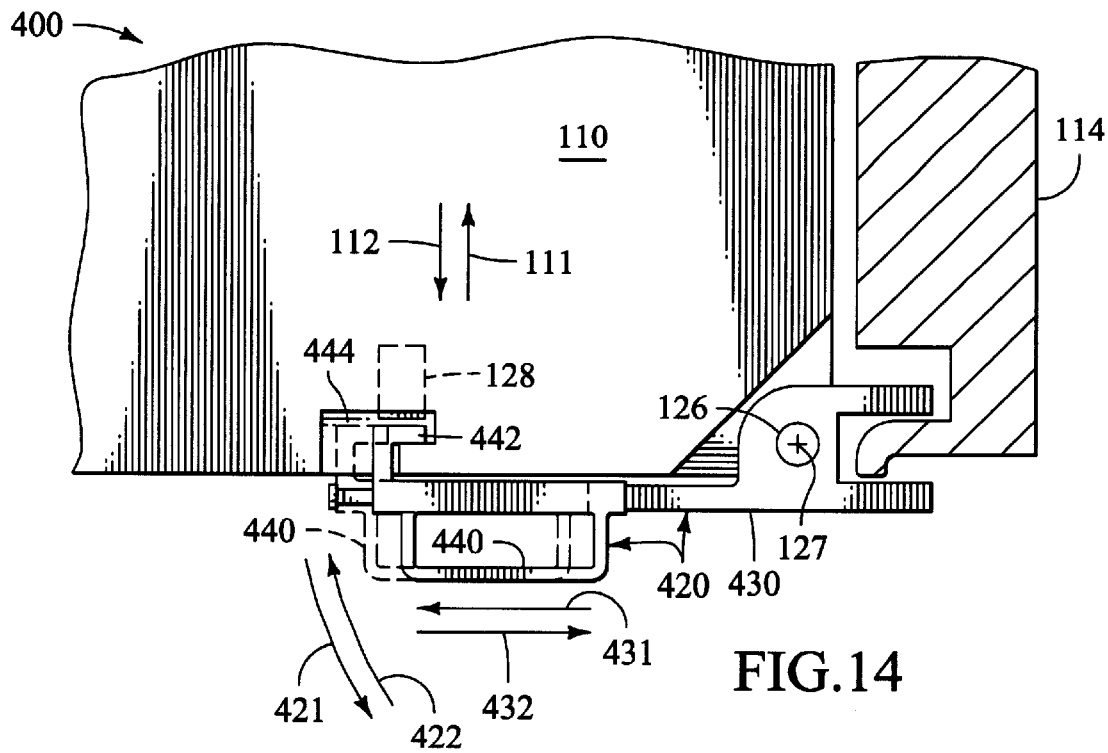
FIG. 14 is a top plan view of the apparatus depicted in FIG. 13, showing first and second positions of the latch assembly.
Figure 15:
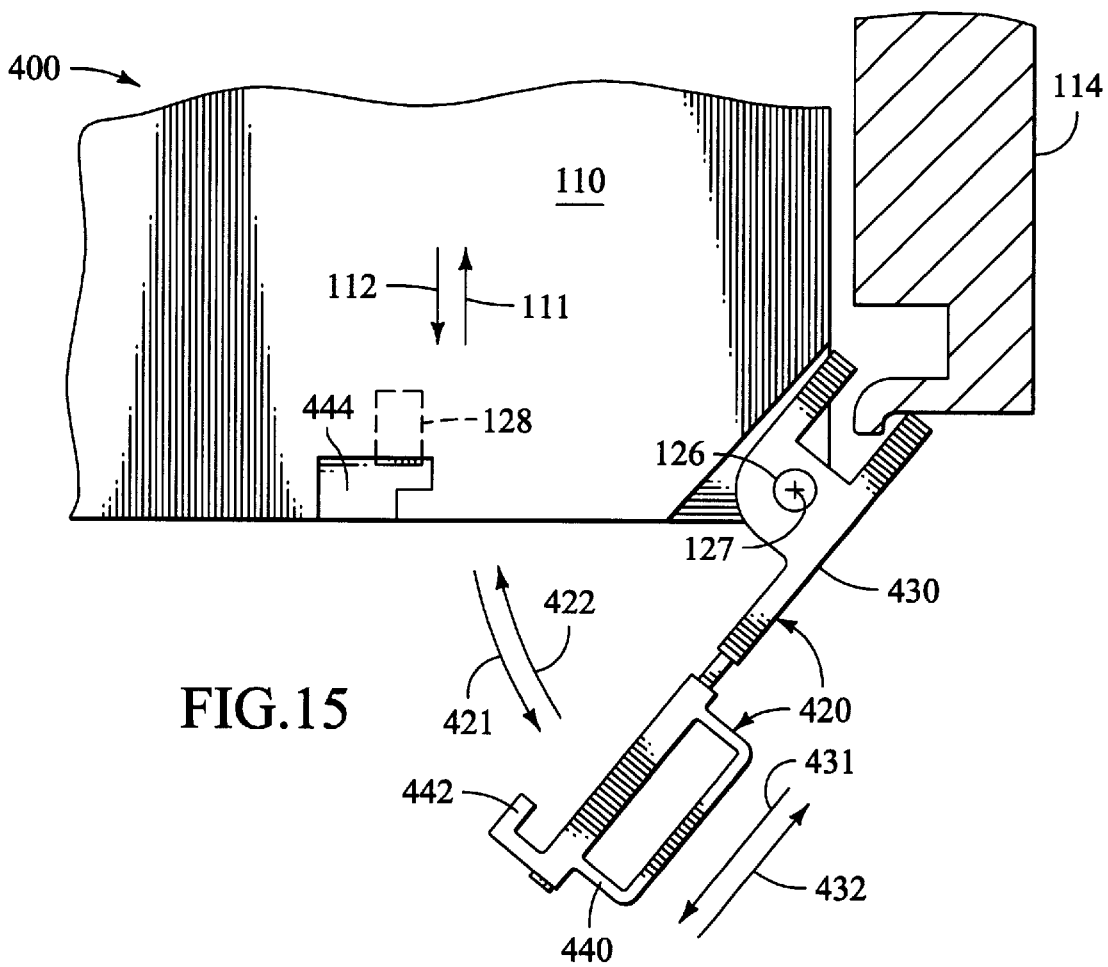
FIG. 15 is another top plan view of the apparatus depicted in FIG. 13, showing a third position of the latch assembly.

Moving to FIGS. 13 through 15, a system 400 is shown in accordance with a fourth embodiment of the present invention. FIG. 13 is an exploded, partial perspective view of the system 400. The system 400 comprises a latch assembly 420 which is rotatably mounted on a module 110 by way of a pivot pin 126. The latch assembly 420 is configured to pivot about a pivot axis 127 defined on the pivot pin 126. It is understood that, in the alternative, the pivot pin 126 can be made integral with the module 110, or can be made integral with the latch assembly 420. The latch assembly 420 comprises an engagement portion 430, which is rotatably mounted on the module 110, and a target portion 440, which is slidably mounted on the engagement portion. The target portion 440 can comprise a lock member 442, which is mounted on the target portion 440, and which is configured to engage a lock chamber 444 which is defined on the module 110. The system 400 also comprises a sensor 128 which can be mounted on the module 110. As is seen, the sensor 128 can be mounted within the lock chamber 444.

Moving to FIG. 14, a partial top view is shown of the system 400 which is depicted in FIG. 13. However, in FIG. 14 the latch assembly 420 is shown fully assembled rather than exploded as shown in FIG. 13. As is seen in FIG. 14, the module 110 is removably supported in a chassis 114. The module 110 is removed from the chassis 114 by movement of the module relative to the chassis in the direction 111. Conversely, the module 110 is installed into the chassis 114 by movement of the module relative to the chassis in the direction 112. As shown in FIG. 14, the module 110 is fully supported on the chassis 114.

As is also seen, the latch assembly 420 is rotatably mounted on the module 110 and is rotatable relative to the module about the pivot axis 127. It is evident that the latch assembly 420 can pivot about the pivot axis 127 in a direction 421 and also in a direction 422. The latch assembly 420 is comprised of a substantially elongated engagement portion 430 which is rotatably mounted on the module 110, and which is configured to pivot about the pivot axis 127. The engagement portion 430 is configured to engage the chassis 114 as is evident.

The latch 420 also comprises a target portion 440 which is slidably mounted on the engagement portion 430. The target portion 440 can move in a substantially linear, slidable manner relative to the engagement portion 430 in a direction 431 and also in a substantially opposite direction 432. The lock member 442 is mounted on the target portion 440 and is movable therewith. As is seen, the lock member 442 is engagable with the lock chamber 444 which is defined in the module 110. The sensor 128, which can be mounted on the module 110 and within the lock chamber 444, is configured to detect the movement, or position, of the target portion 440. The sensor 128 can be configured to detect the presence of the lock member 442.

The latch assembly 420 is positioned in a first position which is shown in solid lines. In the first position, the lock member 442 is fully engaged with the lock chamber 444, and the sensor 128 can detect the movement, or position, of the lock member. It is evident that, when the latch assembly 420 is in the first position, the engagement portion 430 is substantially immobilized because of the engagement of the lock member 442 with the lock chamber 444. That is, the engagement of the lock member 442 with the lock chamber 444 substantially prevents the rotation of the engagement portion 430. Also, when the engagement portion 430 is fully engaged with the chassis 114 as shown, and the latch assembly 420 is in the first position, the module 110 is substantially immobilized relative to the chassis 114 because the engagement member 430 cannot be rotated. In an alternative configuration which is not shown, the latch assembly 420 can be resiliently biased toward the first position. That is, the engagement portion 430 and the target portion 440 can be resiliently biased toward their respective first positions by use of respective resilient members (not shown) such as springs and the like.

Still referring to FIG. 14, it is seen that the target portion 440 can be slidably moved in the first direction 431 from the first position to a second position which is shown in dashed lines. This movement of the target portion 440 from the first position to the second position can be defined as the first range of movement. It is noted that, when the target portion 440 is moved through the first range to the second position, the lock member 442 is no longer fully engaged with the lock chamber 444 so that the engagement portion 430 can be rotated relative to the module 110 in the direction 421. It is also seen that, when the target portion 440 is in the second position, the lock member is no longer proximate to the sensor 128. Thus, the sensor 128 can detect movement of the lock member 442 through the first range from the first to the second position. When the sensor 128 detects such movement of the target portion 440 through the first range, the sensor can generate a signal and communicate the signal to the controller (which is shown in FIG. 4A). the controller, prompted by the signal sent by the sensor 128, can then initiate appropriate action, such as termination of the module operation, which will prepare the module 110 for disconnection and removal from the chassis 114 as discussed above for FIGS. 4 through 12.

Now referring to FIG. 15, it is noted that, as discussed for the above embodiments of the present invention, rotation of the engagement portion 430 can result in movement of the module 110 in the direction 111 relative to the chassis 114. As is seen, the engagement portion 430 has been rotated in the direction 421 from the second position (shown in dashed lines in FIG. 14) to a third position (shown in FIG. 15). This range of movement of the engagement portion 430 from the second position to the third position can be defined as the second range of movement. As is seen, movement of the engagement portion 430 through the second range of movement causes the module 110 to be urged in the direction 111 relative to the chassis 114, and out of its fully supported position. However, as is evident from the discussion above, the sensor 128 can detect movement of the target portion 440 through the first range before the engagement portion 430 moves through the second range.

To reinsert the module 110 into the chassis 114, the module 110 can be placed into the position shown in FIG. 15 relative to the chassis and the latch 420. The latch assembly 420 can then be rotated about the pivot axis 127 in the direction 422 while keeping the target portion 440 in the position shown relative to the engagement portion 430. This will cause the engagement portion 430 to move the module 110 into the chassis 114 in the direction 112. Continued rotation of the latch assembly 420 in the direction 422 can result in the second position of the latch which is shown in dashed lines in FIG. 14. It is noted that, with the latch assembly 420 in the second position, the module 110 will be substantially in its fully supported position on the chassis 114. With the latch assembly 420 in the second position, the target portion 440 can be slidably moved in the direction 432, which will result in the latch assembly again reaching the first position. With the latch assembly 420 in the first position, the module 110 will be substantially immobilized relative to the chassis 114.

Figure 16:
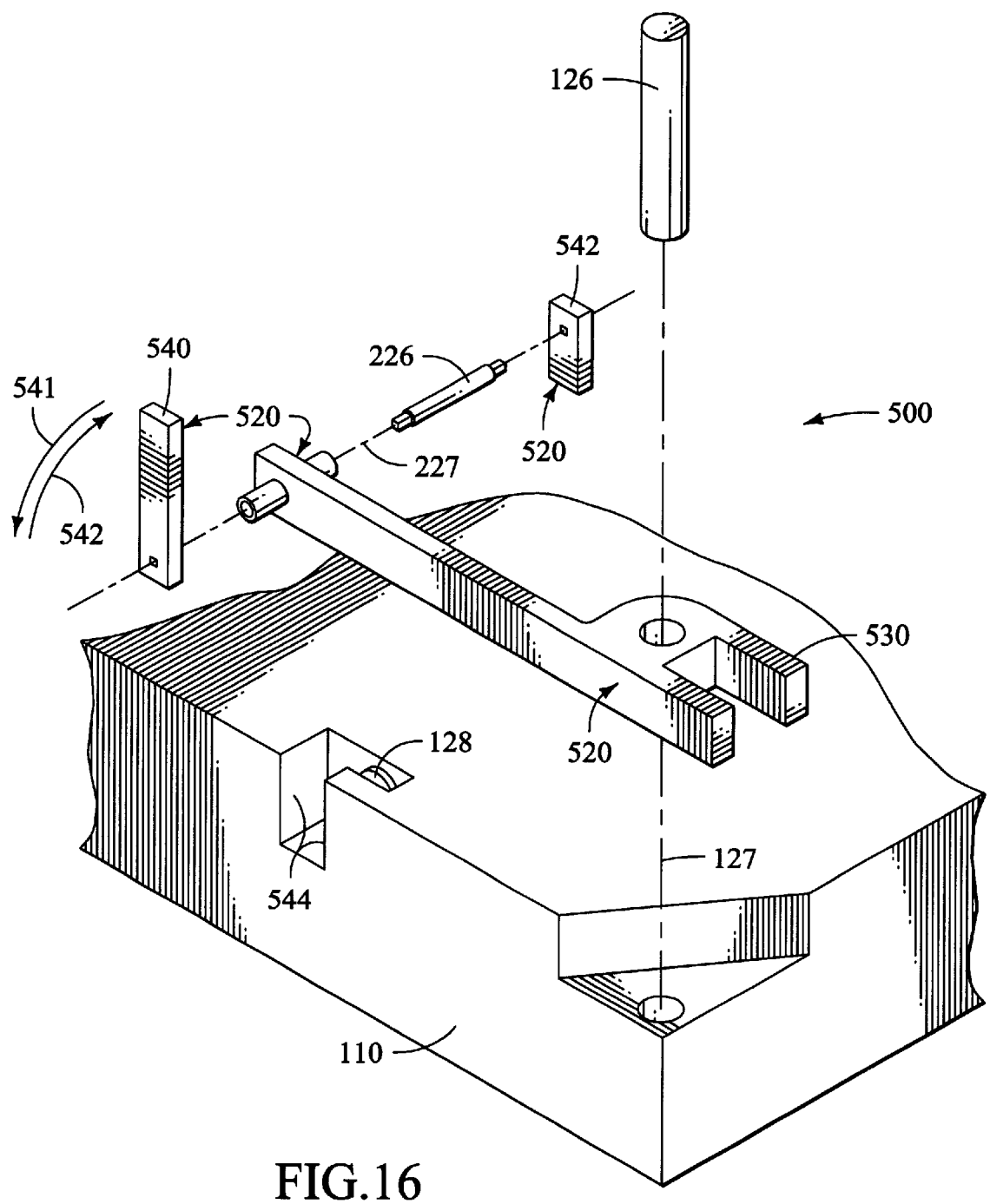
FIG. 16 is an exploded, partial perspective view of a latch assembly in accordance with a fifth embodiment of the present invention.

Now turning to FIGS. 16 through 19, a system 500 is shown in accordance with a fifth embodiment of the present invention. FIG. 16 is an exploded, partial perspective view of the system 500. As is seen, the system 500 comprises a latch assembly 520 which is rotatably mounted on a module 110. The latch assembly 520 can be mounted on the module 110 by way of a pin 126. The pin 126 can, alternatively, be configured as an integral part of the latch assembly 520, or as an integral part of the module 110. The latch assembly 520 can pivot relative to the module 110 about a pivot axis 127. The system 500 further comprises a sensor 128 which can be mounted on the module 110. The sensor 128 can be mounted within a lock chamber 544 which can be defined on the module 110.

The latch 520 comprises an engagement portion 530 which can be rotatably mounted on the module 110, and which can be configured to pivot relative to the module about the pivot axis 127. The latch 520 also comprises a target portion 540 which is rotatably mounted on the engagement portion 530 by way of a secondary pin 226, and which is configured to rotate relative to the engagement portion about a secondary axis 227. The latch 520 further comprises a lock member 542 which can be fixedly mounted on the target portion 540 by way of the pin 226. As is evident, the target portion 540 is configured to rotate relative to the engagement portion 530 in the directions indicated by the arrows 541 and 542. The lock member 544, since it is fixedly mounted on the target portion 540, can rotate therewith in the directions 541 and 542.

Figure 17:
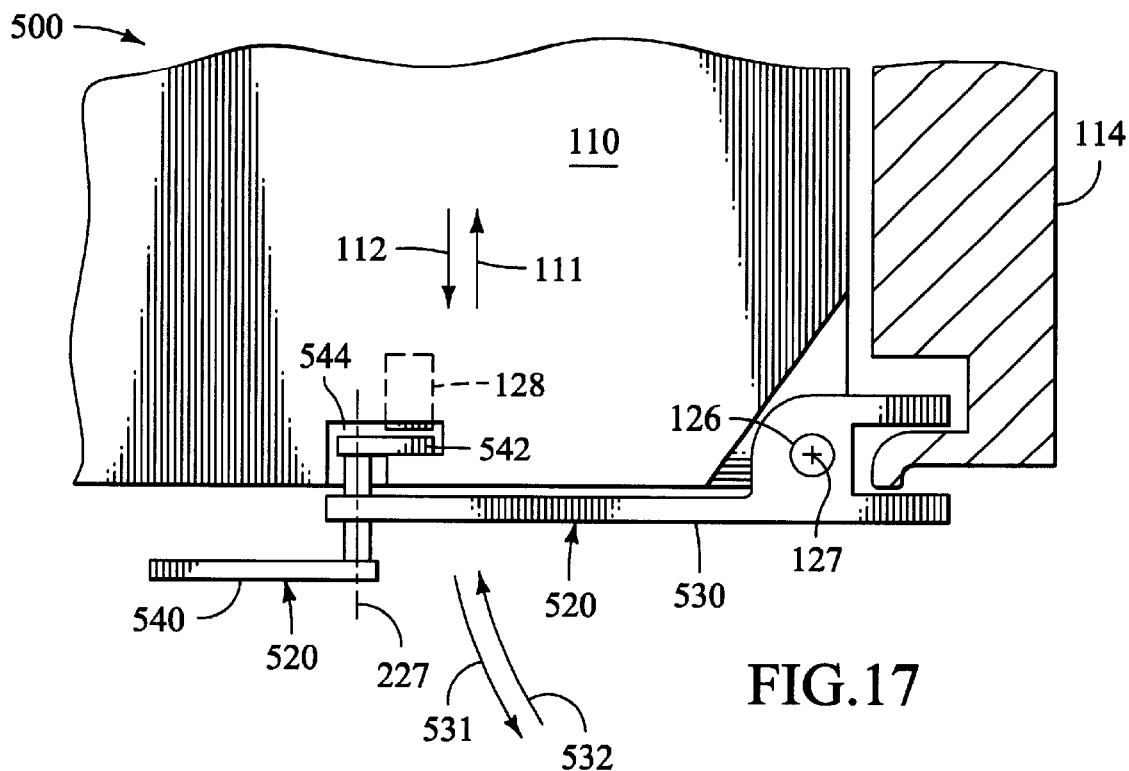
FIG. 17 is a top plan view of the apparatus depicted in FIG. 16, showing a first position of the latch assembly.

Now referring to FIG. 17, the module 110 is removably supported on a chassis 114. The module 110 is removed from the chassis 114 by movement of the module in the direction 111 relative to the chassis. Conversely, the module 110 is installed on the chassis 114 by movement of the module in the direction 112 relative to the chassis. As depicted in FIG.

17 the module 110 is fully installed on the chassis 114. Also as shown, the latch 520 is positioned in a first position. While in the first position, the latch 520 is substantially all the way against the module 110, as shown. Also, while in the first position, the target portion 540 is rotatably positioned relative to the module as shown so that the lock member 542 can be detected by the sensor 128. It is noted that, while the lock member 542 is in the first position, it is also fully engaged with the lock chamber 544 which is defined in the module 110. When fully engaged with the lock chamber 544, the lock member 542 substantially prevents rotation of the engagement portion 530 about the pivot axis 127. In other words, when the latch assembly 520 is in the first position, the engagement member 530 in prevented from rotating about the pivot axis 127. It is noted also, that when the latch assembly 520 is in the first position, and when the module 110 is fully installed in the chassis 114, then the engagement portion 530 is fully engaged with the chassis 114. The engagement of the engagement portion 530 with the chassis 114 while the latch 520 is in the first position substantially prevents movement of the module 110 relative to the chassis.

Figure 18:
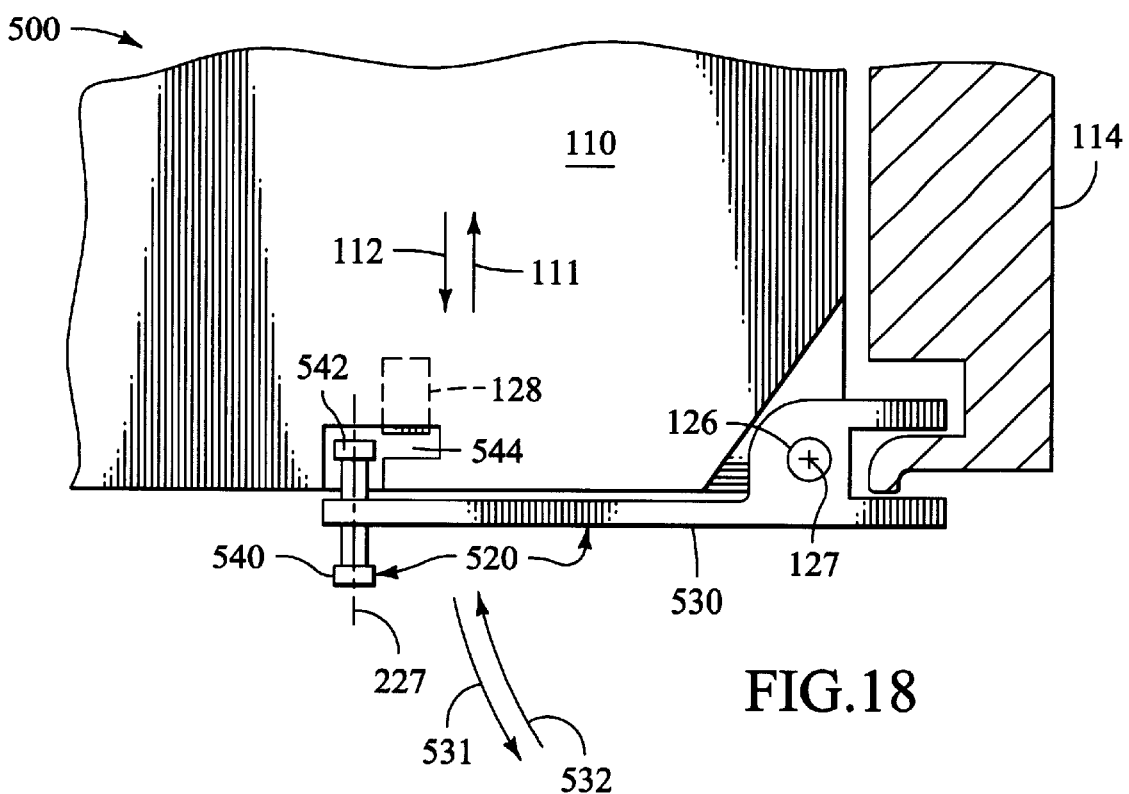
FIG. 18 is another top plan view of the apparatus depicted in FIG. 16, showing a second position of the latch assembly.

Moving now to FIG. 18, it is seen that the target portion 540 has been rotated approximately ninety degrees about the secondary axis 227. As a result of this rotation of the target portion 540, the lock member 542 has also rotated along with the target portion. The rotation of the target portion 540 results in the target member moving from the first position to a second position which is depicted in FIG. 18. This movement of the target portion 540 from the first position to the second position can be defined as the first range of movement. When the target portion 540 is moved to the second position, the sensor 128 can detect movement of the lock member 542. Also, due to the rotation of the target portion 540, the lock member is no longer fully engaged with the lock chamber 544. Therefore, the engagement portion 530 is no longer prevented from rotating in the direction 531 about the pivot axis 127 after the target portion is moved through the first range. However, it is noted that movement of the target portion 540 through the first range is detected by the sensor 128 before the lock member becomes fully disengaged from the lock chamber 544. Because of this, the sensor can send a signal to the module 110 to warn the module of the imminent rotation of the engagement portion 530 before such rotation thereof is possible.

Figure 19:
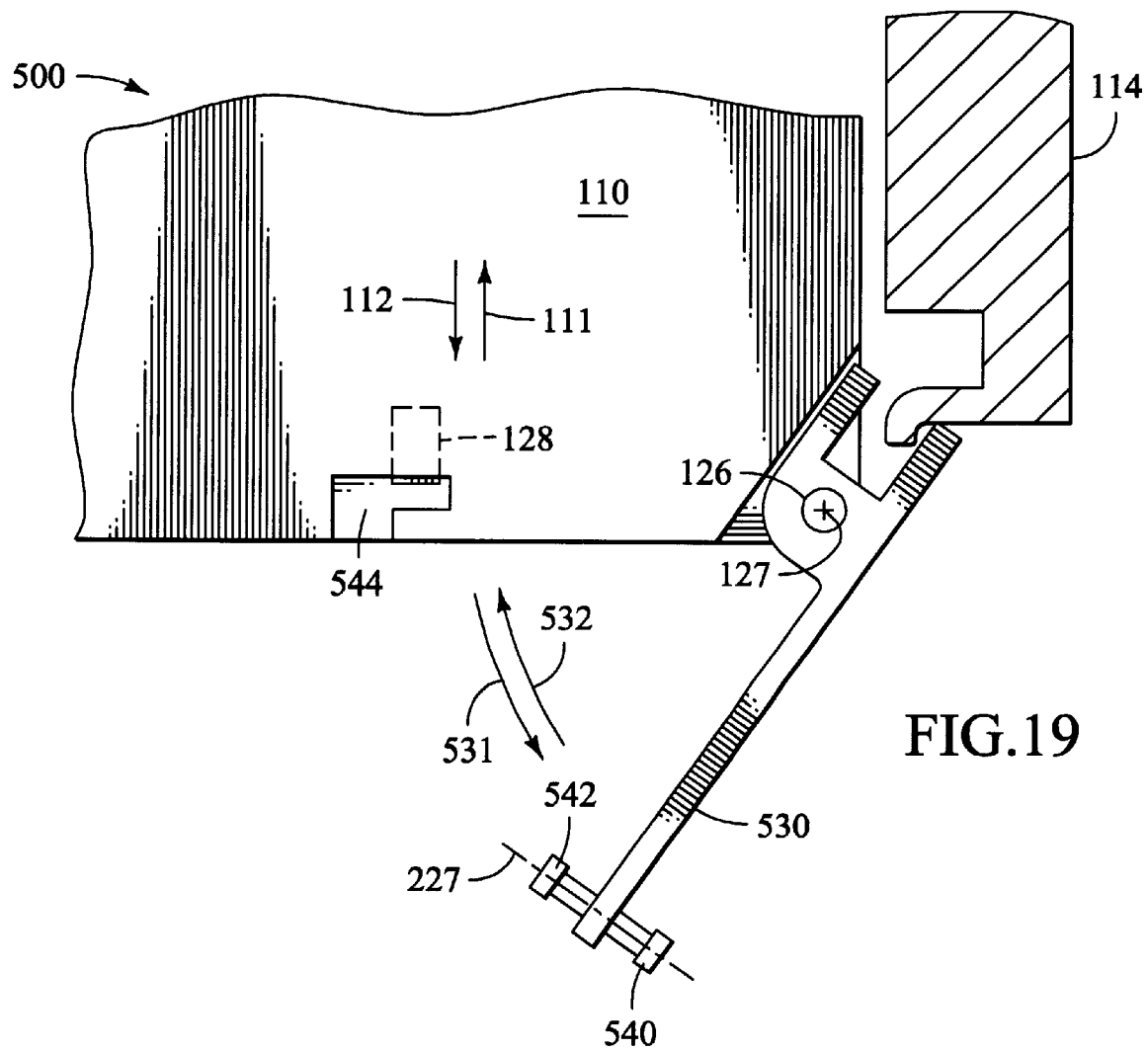
FIG. 19 is another top plan view of the apparatus depicted in FIG. 16, showing a third position of the latch assembly.

Now referring to FIG. 19, it is seen that the latch assembly 520 has been rotated in the direction 531 from the second position to a third position. This movement of the latch assembly from the second position to the third position can be defined as the second range of movement. As is evident, the rotation of the latch assembly 520 through the second range of movement results in movement of the module 110 in the direction 111 relative to the chassis 114. As is seen, movement of the latch assembly through the second range causes the engagement portion 530 to bear against the chassis 114 which, in turn, causes the module to be moved relative to the chassis 114 in the direction 112.

A review of FIGS. 17 through 19 will reveal that rotation of the latch assembly 520 from the third position to the second position will result in the module 110 becoming substantially fully supported on the chassis 114. The target portion 540 can then be rotated about the secondary axis 227 to the first position. The attainment of the first position by the latch assembly 520 will thus result in the lock member 542 becoming fully engaged with the lock chamber 544. In addition, the lock member 542 can become proximate to the sensor 128 when the latch 520 is in the first position shown.

As is the case with any of the other embodiments of the invention described herein, the system 500 can be configured to allow the module 110 to operate only when the latch assembly 520 is in the first position, and the module is in the fully supported position which is depicted in FIG. 17. This will substantially prevent damage to any of the operational aspects of the module 110 as described above. That is, the sensor 128 can be configured to detect when the latch assembly 520 is in the first position, and the module 110 can be allowed to operate only when the latch assembly is in the first position. For example, the sensor 128 can be configured to generate a "safe" signal only when the sensor detects that the latch assembly 520 is in the first position. The sensor 128 can further be configured to communicate this safe signal to the controller 80 which is shown in FIG. 4A. The controller 80 can be configured to allow normal operation of the module 110 only when the safe signal is being received from the sensor 128.

In accordance with a further embodiment of the present invention, the present invention includes a method of removing a module from its fully supported position on a chassis. The method comprises moving a target portion of a latch assembly through a first range of movement, and detecting the movement of the target portion through the first range. The method also can include moving an engagement portion of a latch assembly through a second range, and wherein movement of the engagement portion through the second range causes movement of the module from its fully supported position, and wherein movement of the target portion through the first range occurs prior to the movement of the engagement portion through the second range, The method can also comprise generating a signal when movement of the target portion through the first range is detected. Responding to the signal by terminating the intended operation of the module can also be included, as can the initiation of a shutdown sequence in response to the signal.

While the above invention has been described in language more or less specific as to structural and methodical features, it is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A module removal system for removing a module from a fully supported position on a chassis, the system comprising:

a latch assembly having a target portion configured to move through a first range, and an engagement portion configured to move through a second range, and wherein movement of the engagement portion through the second range acts to move the module from its fully supported position on the chassis, and wherein movement through the second range commences following movement of the target portion through the first range; and a sensor configured to detect movement of the target portion through the first range, and configured to generate a signal in response thereto.

2. The module removal system of claim 1, further comprising:

a controller which is in communication with the module, and which is configured to selectively terminate operation of the module;

the sensor is further configured to communicate the signal to the controller; and wherein, in response to the signal, the controller terminates the operation of the module prior to movement of the engagement portion through the second range.

3. The module removal system of claim 1, and wherein the target portion and the engagement portion are the same component.

4. The module removal system of claim 1, and wherein the target portion and the engagement portion are separate components.

5. The module removal system of claim 4, and wherein the engagement portion is movably mounted on the module and the target portion is movably mounted on the engagement portion.

6. A module removal system for removing a module from a fully supported position on a chassis, the system comprising:

a controller which is in communication with the module, and which is configured to selectively terminate operation of the module;

a latch assembly which is movably mounted on the module, and which comprises a target portion which is movable through a first range, and which further comprises an engagement portion which is movable through a second range, and wherein the target portion moves through the first range prior to movement of the engagement portion through the second range, and wherein movement of the engagement portion through the second range causes movement of the module from the fully supported position; and, a sensor which is mounted on the module, and which is configured to detect movement of the target portion through the first range, and to generate a signal in response thereto, and to communicate the signal to the controller, and wherein, in response to the signal, the controller terminates operation of the module.

7. The module removal system of claim 6, and wherein:

the latch assembly is configured to pivot relative to the module about a pivot axis;

the target portion and the engagement portion are the same component; and, the pivot axis is located substantially between the target portion and the engagement portion.

8. The module removal system of claim 6, and wherein:

the target portion is mounted on the module and is configured to pivot relative to the module about a pivot axis;

the engagement portion is mounted on the module and is configured to pivot relative to the module about the pivot axis; and, movement of the engagement portion and the target portion relative to one another is limited.

9. The module removal system of claim 8, and wherein:

a circumferential slot is defined on the engagement portion; and, a axial projection is defined on the target portion, which projection extends into the slot, and which projection is circumferentially movable within the slot and movably contained thereby to limit movement of the engagement portion and the target portion relative to one another.

10. A module removal system for removing a module from a fully supported position on a chassis, the system comprising:

a controller which is in communication with the module, and which is configured to selectively terminate operation of the module;

a latch assembly which is movably mounted on the module, and which comprises a target portion which is movable through a first range, and which further comprises an engagement portion which is movable through a second range, and wherein the target portion moves through the first range prior to movement of the engagement portion through the second range, and wherein movement of the engagement portion through the second range causes movement of the module from the fully supported position; and, a sensor which is mounted on the module, and which is configured to detect movement of the target portion through the first range, and to generate a signal in response thereto, and to communicate the signal to the controller, and wherein, in response to the signal, the controller terminates operation of the module; and, wherein:

the target portion and the engagement portion are separate components;

the engagement portion is mounted on the module and is configured to pivot relative to the module about a pivot axis; and, the target portion is mounted on the engagement portion and is configured to pivot relative to the engagement portion about a secondary pivot axis.

11. The module removal system of claim 10, and wherein the pivot axis and the secondary pivot axis are substantially parallel to one another.

12. The module removal system of claim 11, and wherein the sensor detects movement of the target portion by detecting the presence of the lock member when engaged with the module.

13. The module removal system of claim 10, and wherein the target portion comprises a lock member which is mounted thereon and configured to rotate therewith, and which is configured to be engaged with the module, and wherein engagement of the lock member with the module substantially prevents movement of the engagement portion through the second range.

14. The module removal system of claim 10, and wherein the secondary pivot axis is oriented substantially tangentially relative to the pivot axis.

15. A module removal system for removing a module from a fully supported position on a chassis, the system comprising:

a controller which is in communication with the module, and which is configured to selectively terminate operation of the module;

a latch assembly which is movably mounted on the module, and which comprises a target portion which is movable through a first range, and which further comprises an engagement portion which is movable through a second range, and wherein the target portion moves through the first range prior to movement of the engagement portion through the second range, and wherein movement of the engagement portion through the second range causes movement of the module from the fully supported position; and, a sensor which is mounted on the module, and which is configured to detect movement of the target portion through the first range, and to generate a signal in response thereto, and to communicate the signal to the controller, and wherein, in response to the signal, the controller terminates operation of the module; and, wherein:

the engagement portion is mounted on the module and is configured to pivot relative to the module about a pivot axis; and, the target portion is slidably mounted on the engagement portion.

16. The module removal system of claim 15, and wherein the target portion comprises a lock member which is mounted thereon and which is configured to engage the module, and wherein the engagement of the lock member with the module substantially prevents movement of the engagement portion through the second range.

17. The module removal system of claim 16, and wherein the sensor detects movement of the target portion by detecting the presence of the lock member when engaged with the module.

18. A method of removing a module from a fully supported position on a chassis, the method comprising:

moving a target portion of a latch assembly through a first range;

detecting movement of the target portion through the first range; and, moving an engagement portion of the latch assembly through a second range, and wherein movement of the engagement portion through the second range causes movement of the module away from the fully supported position.

19. The method of claim 18, and further comprising generating a signal when movement of the target portion is detected.

20. The method of claim 19, and further comprising responding to the signal by terminating the operation of the module.

21. The method of claim 19, and further comprising responding to the signal by initiating a module shut-down sequence.

* * * * *